(12) United States Patent
Omori

(10) Patent No.: US 12,087,622 B1
(45) Date of Patent: Sep. 10, 2024

(54) METHOD OF MANUFACTURING SEMICONDUCTOR DEVICE

(71) Applicant: Renesas Electronics Corporation, Tokyo (JP)

(72) Inventor: Kazuyuki Omori, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 18/585,489

(22) Filed: Feb. 23, 2024

(51) Int. Cl.
*H01L 21/768* (2006.01)
(52) U.S. Cl.
CPC .. *H01L 21/76825* (2013.01); *H01L 21/76805* (2013.01); *H01L 21/7684* (2013.01)
(58) Field of Classification Search
CPC ............... H01L 21/76805; H01L 21/7684
See application file for complete search history.

(56) References Cited

U.S. PATENT DOCUMENTS 11,121,027 B2 * 9/2021 Lu ..................... H01L 21/02164
2017/0054011 A1 2/2017 Matsuura

FOREIGN PATENT DOCUMENTS

JP 2017-041547 A 2/2017

\* cited by examiner

*Primary Examiner* — Mohammad M Choudhry
(74) *Attorney, Agent, or Firm* — Rimon P.C.

(57) ABSTRACT

A method for manufacturing a semiconductor device comprising (a) preparing a semiconductor substrate, (b) forming semiconductor elements on the semiconductor substrate, (c) forming an interlayer insulating film on the semiconductor substrate so as to cover the semiconductor elements, (d) forming a first implantation layer in the interlayer insulating film by performing a first ion-implantation, (e) forming a contact hole in the interlayer insulating film, (f) forming a conductive film on the interlayer insulating film so as to fill in the contact hole, (g) removing the conductive film located outside the contact hole by a polishing so that the conductive film inside the contact hole remains. In the (g) step, the polishing is also performed on the interlayer insulating film. And during the polishing, a polishing rate of the first implantation layer is different from a polishing rate of the interlayer insulating film other than the first implantation layer.

16 Claims, 35 Drawing Sheets

A-A cross section

A-A cross section

A-A cross section

A-A cross section

A-A cross section

METHOD OF MANUFACTURING SEMICONDUCTOR DEVICE

BACKGROUND

The present invention relates to a method for manufacturing a semiconductor device, particularly to a method for manufacturing a semiconductor device having an interlayer insulating film formed on a semiconductor substrate.

In a semiconductor device (semiconductor chip), semiconductor elements such as transistors are formed on the semiconductor substrate, and the semiconductor elements are covered with the interlayer insulating film. Wirings are formed on the interlayer insulating film, and plugs made of a conductive film are formed in the interlayer insulating film. The semiconductor elements are electrically connected to the wirings via the plugs.

For example, Japanese Patent Laid-Open No. 2017-041547 (Patent Document 1) discloses a semiconductor device having an IGBT (Insulated Gate Bipolar Transistor) with a trench gate structure as the semiconductor elements. The IGBT is covered with the interlayer insulating film.

SUMMARY

To form a plug, first, a conductive film is formed on the interlayer insulating film so as to fill the inside of a hole in the interlayer insulating film. Then, the conductive film located outside the hole is removed by polishing so that the conductive film inside the hole remains. After that, wirings are formed on the interlayer insulating film, and the semiconductor elements and the wirings are electrically connected via the plugs.

If an upper surface of the interlayer insulating film is not flat, for example, if a concave portion is formed on the upper surface of the interlayer insulating film, there is a possibility that residues of the conductive film will remain in the concave portion when the conductive film is removed by polishing. If such residues exist between each wiring, the residues function as a leak path and become a cause of short-circuit failure. Therefore, it is required to improve the reliability of the semiconductor device by suppressing the generation of residues on the interlayer insulating film.

Other objects and novel features will become apparent from the description of this specification and the accompanying drawings.

The typical ones of the embodiments disclosed in the present application will be briefly described as follows.

A method for manufacturing a semiconductor device according to one embodiment includes the steps of: (a) preparing a first conductive type semiconductor substrate having an upper surface and a bottom surface; (b) forming semiconductor elements on the semiconductor substrate; (c) forming an interlayer insulating film on the upper surface of the semiconductor substrate so as to cover the semiconductor elements; (d) forming a first implantation layer, which is a part of the interlayer insulating film, in the interlayer insulating film by performing a first ion-implantation; (e) forming a contact hole in the interlayer insulating film; (f) forming a conductive film on the interlayer insulating film so as to fill the inside of the contact hole; (g) removing the conductive film located outside the contact hole by a polishing so that the conductive film inside the contact hole remains. In the (g) step, the polishing is also performed on the interlayer insulating film, and during the polishing, a polishing rate of the first implantation layer is different from a polishing rate of the interlayer insulating film other than the first implantation layer.

DETAILED DESCRIPTION

Figure 1:
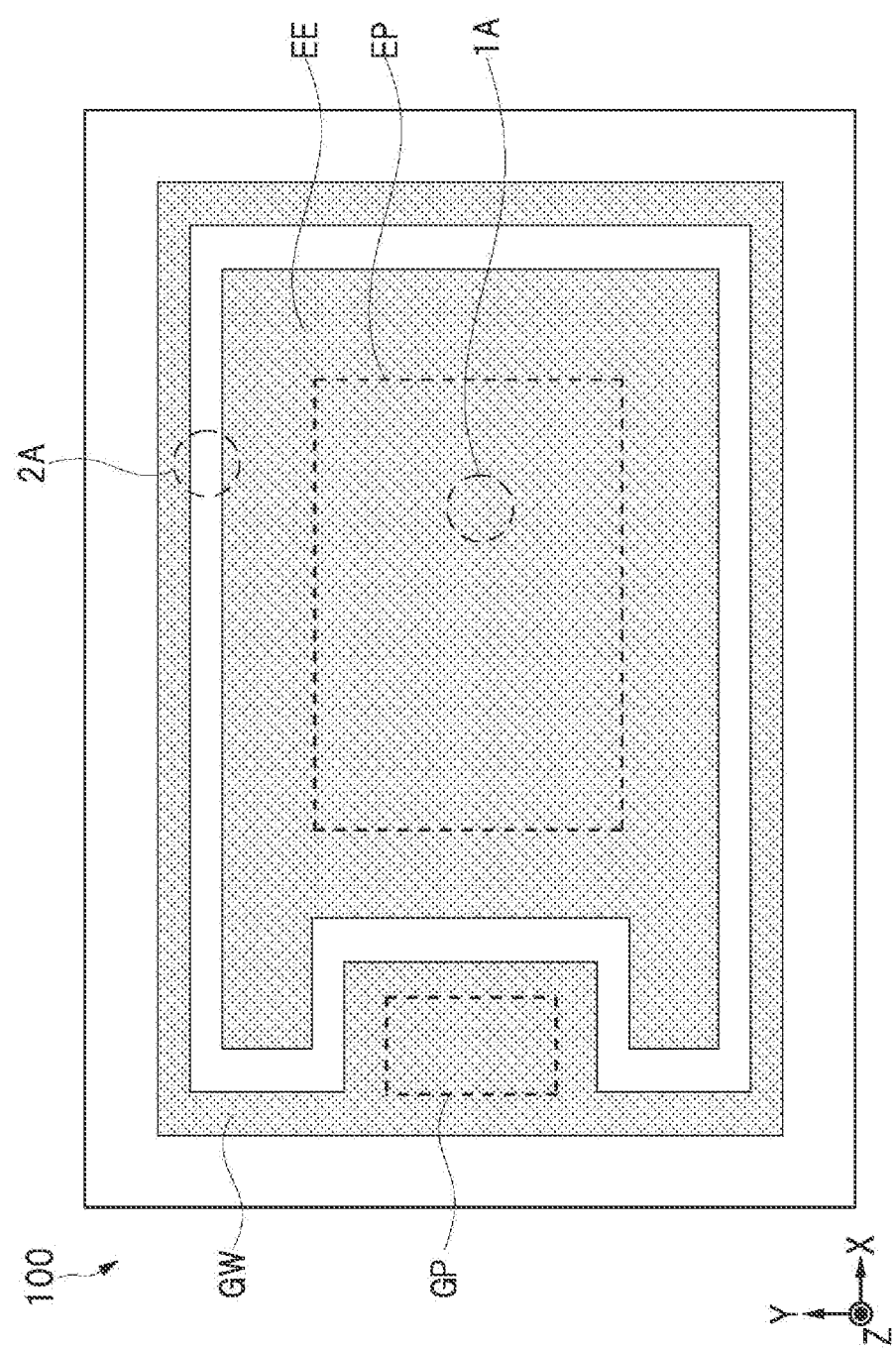
FIG. 1 is a plan view showing a semiconductor device according to a first embodiment.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X direction, the Y direction, and the Z direction described in the present application intersect each other and are orthogonal to each other. In the present application, the Z direction is described as a vertical direction, a height direction, or a thickness direction of a certain structure. In addition, the expression "plan view" used in the present application means that the plane formed by the X direction and the Y direction is a "plane" and the "plane" is viewed from the Z direction.

First Embodiment (Structure of Semiconductor Device)

The semiconductor device 100 in the first embodiment will be described below using FIGS. 1 to 3. FIG. 1 is a plan view showing a semiconductor chip which is the semiconductor device 100. The semiconductor device 100 includes semiconductor elements. Here, an IGBT with a trench gate structure is exemplified as an example of the semiconductor elements.

As shown in FIG. 1, most of the semiconductor device 100 is covered by an emitter electrode EE and a gate wiring GW. A plurality of cells constituting the IGBT are formed under the emitter electrode EE. The gate wiring GW surrounds the emitter electrode EE in plan view.

Although not shown, the emitter electrode EE and the gate wiring GW are covered with a protective film such as a polyimide film. An opening is formed in the protective film on a part of each of the emitter electrode EE and the gate wiring GW. An exposed emitter electrode EE and the gate wiring GW at the opening form an emitter pad EP and an gate pad GP, respectively. By connecting an external connection terminal to the emitter pad EP and the gate pad GP, the semiconductor device 100 is electrically connected to a lead frame, another semiconductor chip, or a wiring substrate. The external connection terminal is either a wire bonding made of gold, copper, or aluminum, or a clip made of a copper plate.

The semiconductor device 100 includes a cell region 1A and an outer peripheral region 2A that surrounds the cell region 1A in plan view. The cell region 1A is where a plurality of cells constituting the IGBT are formed. The outer peripheral region 2A is mainly used to connect the gate wiring GW to a gate electrode GE1 (not shown) and to function as a termination region.

(Structure of IGBT)

Figure 2:
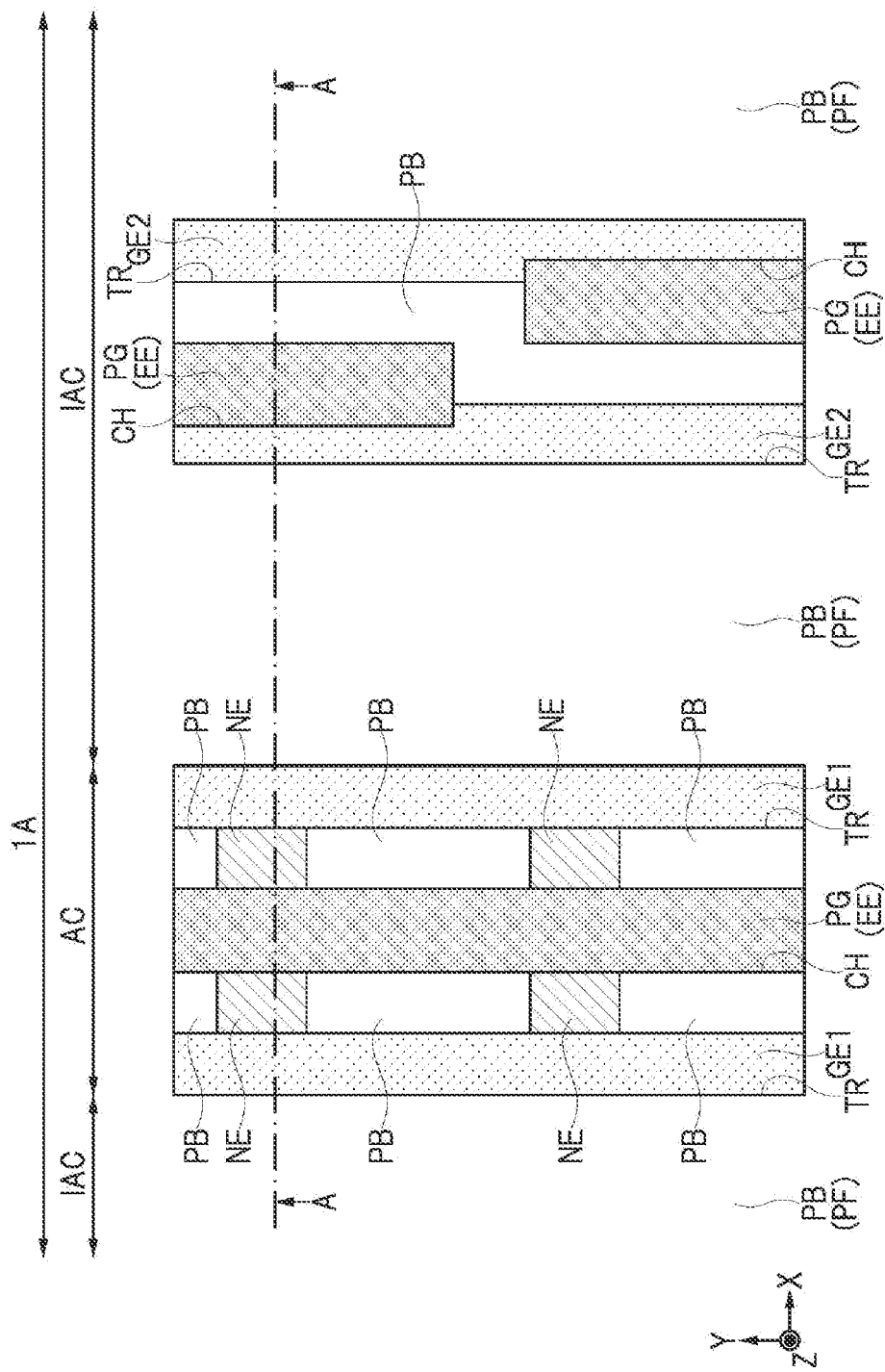
FIG. 2 is a main portion plan view showing the semiconductor device according to the first embodiment.

FIG. 2 is a plan view of the main portion corresponding to the cell region 1A. FIG. 3 is a cross-sectional view taken along line A-A in FIG. 2. The cell region 1A of the semiconductor device 100 has active cells AC that perform the main operation of the IGBT and inactive cells IAC provided between the active cells AC.

As shown in FIG. 2, a plurality of trenches TR extend in the Y direction and are adjacent to each other in the X direction. The gate electrode GEL is formed inside the trench TR of an active cell AC. A gate electrode GE2 is formed inside the trench TR of an inactive cell IAC. The trench TR formed in the active cell AC and the gate electrode GEL form a gate trench. The trench TR formed in the inactive cell IAC and the gate electrode GE2 form an emitter trench.

The gate electrode GE1 of the active cell AC is electrically connected to the gate wiring GW, and a gate potential is supplied during the operation of the IGBT. The gate electrode GE2 of the inactive cell IAC is electrically connected to the emitter electrode EE, and an emitter potential is supplied during the operation of the IGBT. Also, the emitter electrode EE is electrically connected to a base region PB and an emitter region NE of the active cell AC and the base region PB of the inactive cell IAC, and an emitter potential is supplied during the operation of the IGBT.

Figure 3:
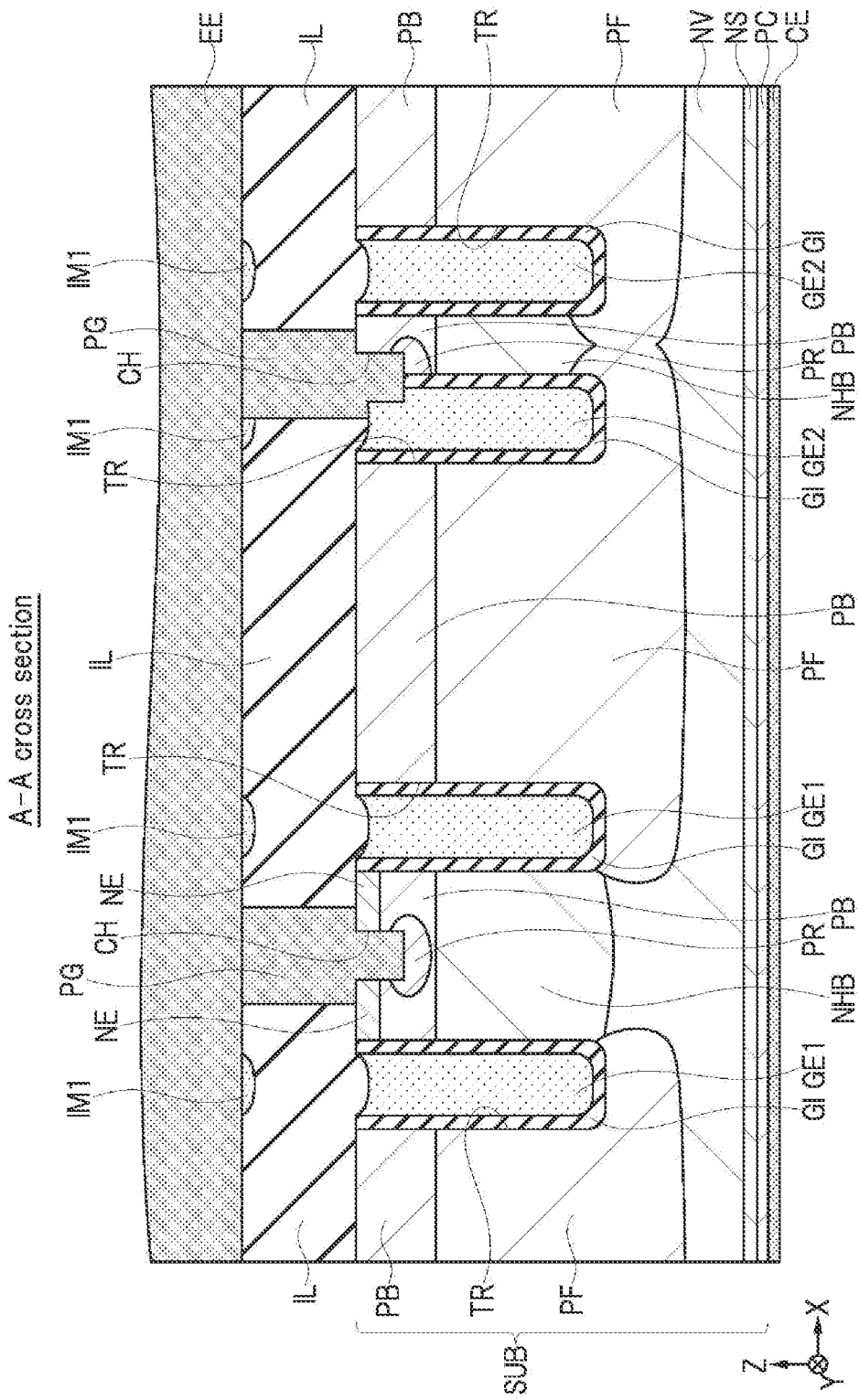
FIG. 3 is a cross-sectional view showing the semiconductor device according to the first embodiment.

As shown in FIG. 3, the semiconductor device 100 includes an n-type semiconductor substrate SUB having an upper surface and a bottom surface. The semiconductor substrate SUB is made of n-type silicon and has a drift region NV. Here, the n-type semiconductor substrate SUB itself constitute the drift region NV. The semiconductor substrate SUB may be a laminate of an n-type silicon substrate and an n-type silicon layer grown by introducing phosphorus (P) by epitaxial growth on the silicon substrate. In that case, the n-type silicon layer with a lower impurity concentration than the n-type silicon substrate constitutes the drift region NV.

On the bottom surface of the semiconductor substrate SUB, an n-type field stop region (impurity region) NS is formed in the semiconductor substrate SUB. The impurity concentration of the field stop region NS is higher than that of the drift region NV. The field stop region NS is provided to prevent the depletion layer extending from the pn junction on the upper surface of the semiconductor substrate SUB from reaching the p-type collector region PC during the turn-off of the IGBT.

On the bottom surface of the semiconductor substrate SUB, a p-type collector region (impurity region) PC is formed in the semiconductor substrate SUB. The collector region PC is located below the field stop region NS.

Below the bottom surface of the semiconductor substrate SUB, a collector electrode CE is formed. The collector electrode CE is electrically connected to the collector region PC and supplies a collector potential to the collector region PC. The collector electrode CE is a single-layer metal film such as an Au film, Ni film, Ti film or AlSi film, or a laminated metal film formed by appropriately laminating these. The field stop region NS, the collector region PC, and the collector electrode CE are formed not only in the cell region 1A but also in the outer peripheral region 2A, etc., over the entire semiconductor substrate SUB.

In the semiconductor substrate SUB, the trench TR having a predetermined depth from the upper surface to the bottom surface of the semiconductor substrate SUB is formed. A gate dielectric film GI is formed inside the trench TR. Inside the trench TR via the gate dielectric film GI, the gate electrodes GE1, GE2 are formed. The gate dielectric film GI is, for example, a silicon oxide film. The gate electrodes GE1, GE2 are conductive films, for example, polysilicon films into which n-type impurities have been introduced.

On the upper surface of the semiconductor substrate SUB of the active cell AC, a hole barrier region (impurity region) NHB is formed in the semiconductor substrate SUB between a pair of trenches TR (a pair of gate electrodes GE1). The impurity concentration of the hole barrier region NHB is higher than that of the drift region NV.

A p-type base region (impurity region) PB is formed in the hole barrier region NHB. The n-type emitter region (impurity region) NE is formed in the p-type base region PB. The impurity concentration of the emitter region NE is higher than that of the drift region NV. The base region PB is formed to be shallower than a depth of the trench TR, and the emitter region NE is formed to be shallower than a depth of the base region PB.

As shown in FIG. 2, a multiple emitter regions NE are formed between the pair of trenches TR (the pair of gate electrodes GE1) and are formed at a predetermined distance from each other along the Y direction. The base region PB located below the emitter region NE adjacent to the gate electrode GE1 is used as a channel region.

In the inactive cell IAC, on the upper surface of the semiconductor substrate SUB, the hole barrier region NHB is formed within the semiconductor substrate SUB between a pair of trenches TR (a pair of gate electrodes GE2). Also, within the semiconductor substrate SUB between the gate electrode GE1 and the gate electrode GE2, a p-type floating region (impurity region) PF is formed. That is, the floating region PF is formed within the semiconductor substrate SUB of the cell region 1A other than between the pair of trenches TR. Within the hole barrier region NHB and the floating region PF, the p-type base region PB is formed. The impurity concentration of the base region PB is higher than that of the floating region PF.

The floating region PF and the base region PB formed within the floating region PF are not electrically connected to the gate wiring GW and the emitter electrode EE, and are electrically floating.

In the active cell AC and the inactive cell IAC, the interlayer insulating film IL is formed on the upper surface of the semiconductor substrate SUB to cover the semiconductor elements (IGBT). The interlayer insulating film IL is an impurity-free silicon oxide film, for example, a TEOS (Tetra ethoxy silane) oxide film. A thickness of the interlayer insulating film IL is, for example, 600 nm or more and 1500 nm or less. Also, a first implantation layer IM1 is formed in the interlayer insulating film IL.

The interlayer insulating film IL may be an insulating film having a lower dielectric constant than silicon oxide ($SiO_2$). Such a low dielectric constant insulating film is, for example, a silicon oxide film (SiOC film) containing carbon.

In the active cell AC, a contact hole CH penetrates the interlayer insulating film IL and the emitter region NE, and reaches inside the base region PB. The contact hole CH is formed to contact the emitter region NE and the base region PB.

In the inactive cell IAC, the contact hole CH penetrates the interlayer insulating film IL and reaches inside the base region PB. Also, the contact hole CH is formed to overlap the gate electrode GE2 and the gate dielectric film GI in plan view. Therefore, the contact hole CH in the inactive cell IAC is formed to contact the gate electrode GE2 and the base region PB.

In the active cell AC and the inactive cell IAC, a p-type high concentration diffusion region (impurity region) PR is formed in the base region PB around the bottom of the contact hole CH. The impurity concentration of the high concentration diffusion region PR is higher than that of the base region PB. The high concentration diffusion region PR is mainly provided to reduce the contact resistance with a plug PG.

Inside the contact hole CH, the plug PG is embedded. The plug PG is made of a conductive film. The conductive film includes, for example, a barrier metal film and a main conductive film formed on the barrier metal film. The barrier metal film is a laminated film of a titanium film and a titanium nitride film formed on the titanium film. The main conductive film is, for example, a tungsten film.

Although not shown here, in the outer peripheral region 2A, some of the contact hole CH is also formed on a part of the gate electrode GE1, and the plug PG is formed inside this contact hole CH.

The emitter electrode EE is formed on the interlayer insulating film IL. The emitter electrode EE is electrically connected to the emitter region NE, the base region PB, the high concentration diffusion region PR, and the gate electrode GE2 through the plug PG, and supplies an emitter potential to these regions. Although not shown here, the gate wiring GW is also formed on the interlayer insulating film IL in the same manufacturing process as the emitter electrode EE. The gate wiring GW is electrically connected to the gate electrode GE1 through the plug PG, and supplies a gate potential to the gate electrode GE1.

Such the emitter electrode EE and gate wiring GW include the barrier metal film and a main conductive film formed on the barrier metal film. The barrier metal film is, for example, a TiW film. The main conductive film is, for example, an aluminum alloy film to which copper or silicon has been added.

(Manufacturing Method of Semiconductor Device)

Using FIGS. 4 to 15, I will explain each manufacturing process included in the manufacturing method of the semiconductor device 100 in the first embodiment.

Figure 4:
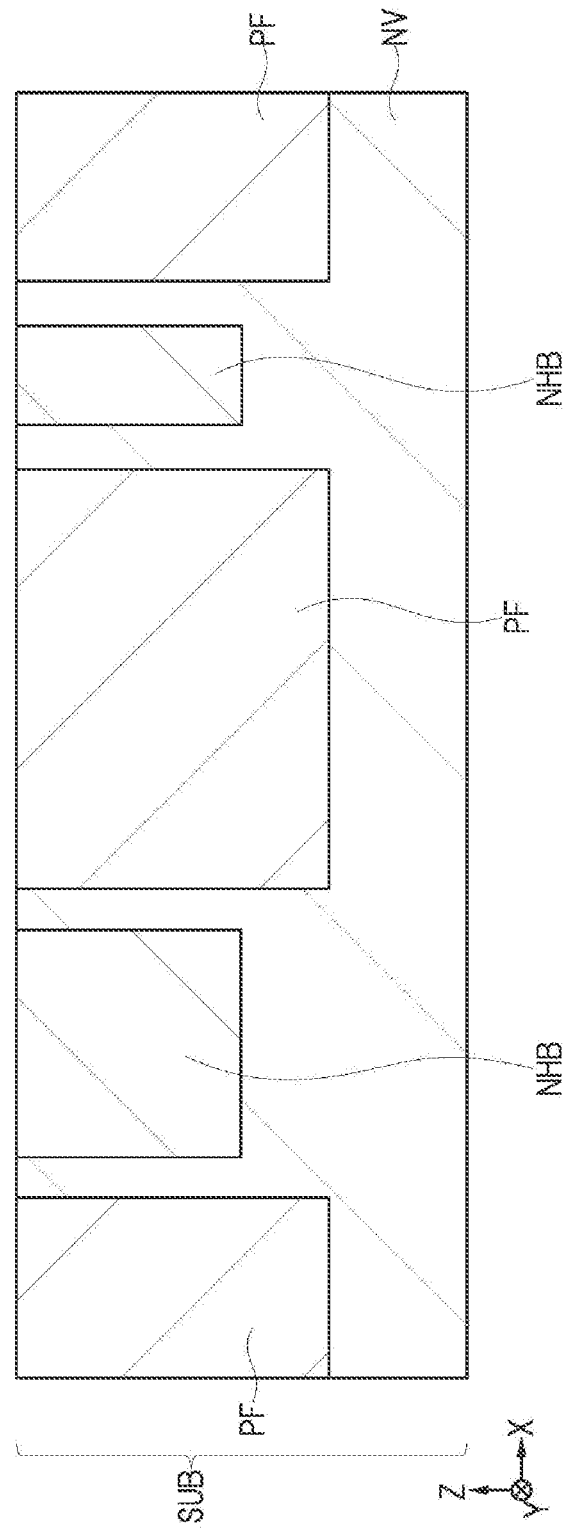
FIG. 4 is a cross-sectional view showing a manufacturing step of the semiconductor device according to the first embodiment.

As shown in FIG. 4, prepare the semiconductor substrate SUB having the n-type drift region NV. The semiconductor substrate SUB is made of n-type silicon. As mentioned above, the semiconductor substrate SUB may be a laminate of an n-type silicon substrate and an n-type silicon layer grown by introducing phosphorus (P) by an epitaxial growth method on the silicon substrate.

Next, by photolithography technology and ion-implantation method, the n-type hole barrier region NHB is formed in the semiconductor substrate SUB on the upper surface. Then, by photolithography technology and ion-implantation method, the p-type floating region PF is formed in the semiconductor substrate SUB on the upper surface.

Figure 5:
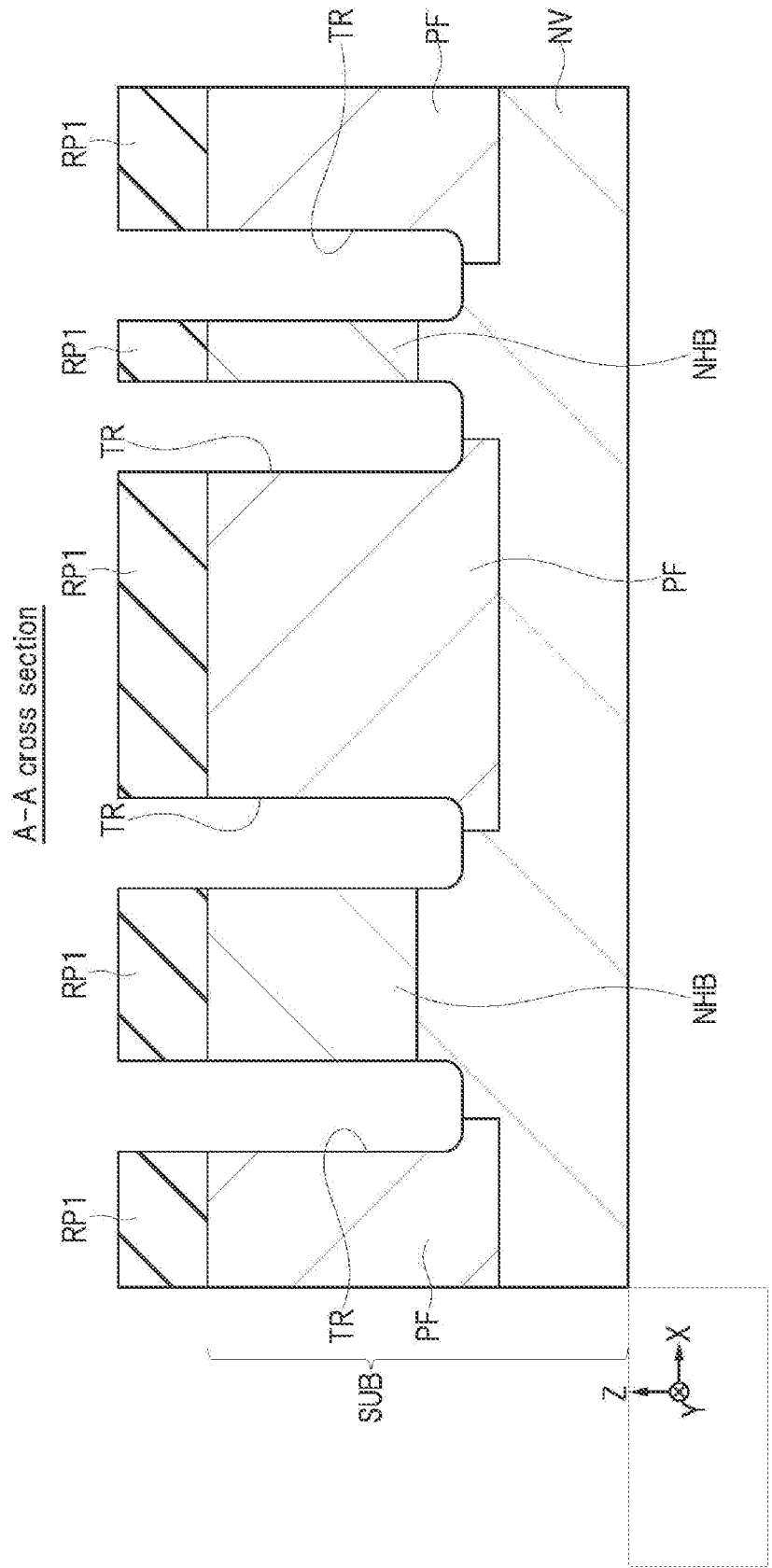
FIG. 5 is a cross-sectional view showing a manufacturing step of the semiconductor device performed after the step shown in FIG. 4.

As shown in FIG. 5, the pair of trenches TR are formed in the semiconductor substrate SUB of the active cell AC and the inactive cell IAC. First, a resist pattern RP1 is formed on the upper surface of the semiconductor substrate SUB. Then, using the resist pattern RP1 as a mask, an anisotropic etching is performed on the semiconductor substrate SUB. By this process, multiple trenches TR are formed in the semiconductor substrate SUB. The trench TR have a certain depth from the upper surface of the semiconductor substrate SUB to the bottom surface of the semiconductor substrate SUB. Thereafter, the resist pattern RP1 is removed by an ashing process.

Figure 6:
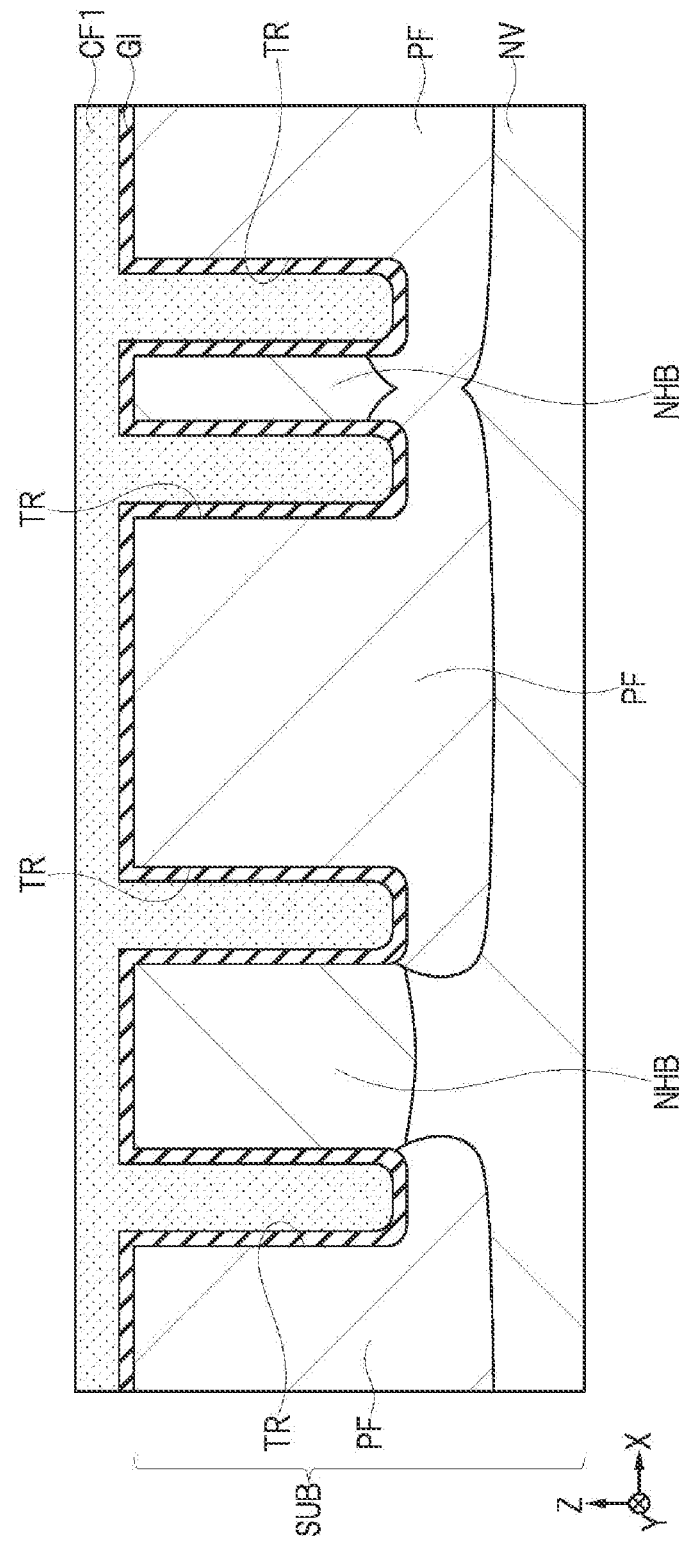
FIG. 6 is a cross-sectional view showing a manufacturing step of the semiconductor device performed after the step shown in FIG. 5.

As shown in FIG. 6, after diffusing the impurities contained in the hole barrier region NHB and the floating region PF, the gate dielectric film GI and a conductive film CF1 are formed inside the trench TR.

First, although not shown, a sacrificial oxide film is formed inside the trench TR and on the upper surface of the semiconductor substrate SUB. This removes the damage layer formed in the semiconductor substrate SUB. The sacrificial oxide film is formed by heat-treating the semiconductor substrate SUB. This heat treatment is performed, for example, in an atmosphere filled with oxygen gas, at 1100 degree Celsius, and under conditions of 30 minutes or more and 60 minutes or less. By this heat treatment, the impurities contained in the hole barrier region NHB and the floating region PF are diffused. Then, the sacrificial oxide film is removed by an isotropic etching using a solution containing, for example, hydrofluoric acid.

Next, the gate dielectric film GI is formed inside the trench TR and on the upper surface of the semiconductor substrate SUB by a thermal oxidation process. Then, the conductive film CF1 is formed inside the trench TR and on the upper surface of the semiconductor substrate SUB, for example, by a CVD method, so as to fill the inside of the trench TR through the gate dielectric film GI. The conductive film CF1 is, for example, a polysilicon film into which an n-type impurity has been introduced.

Figure 7:
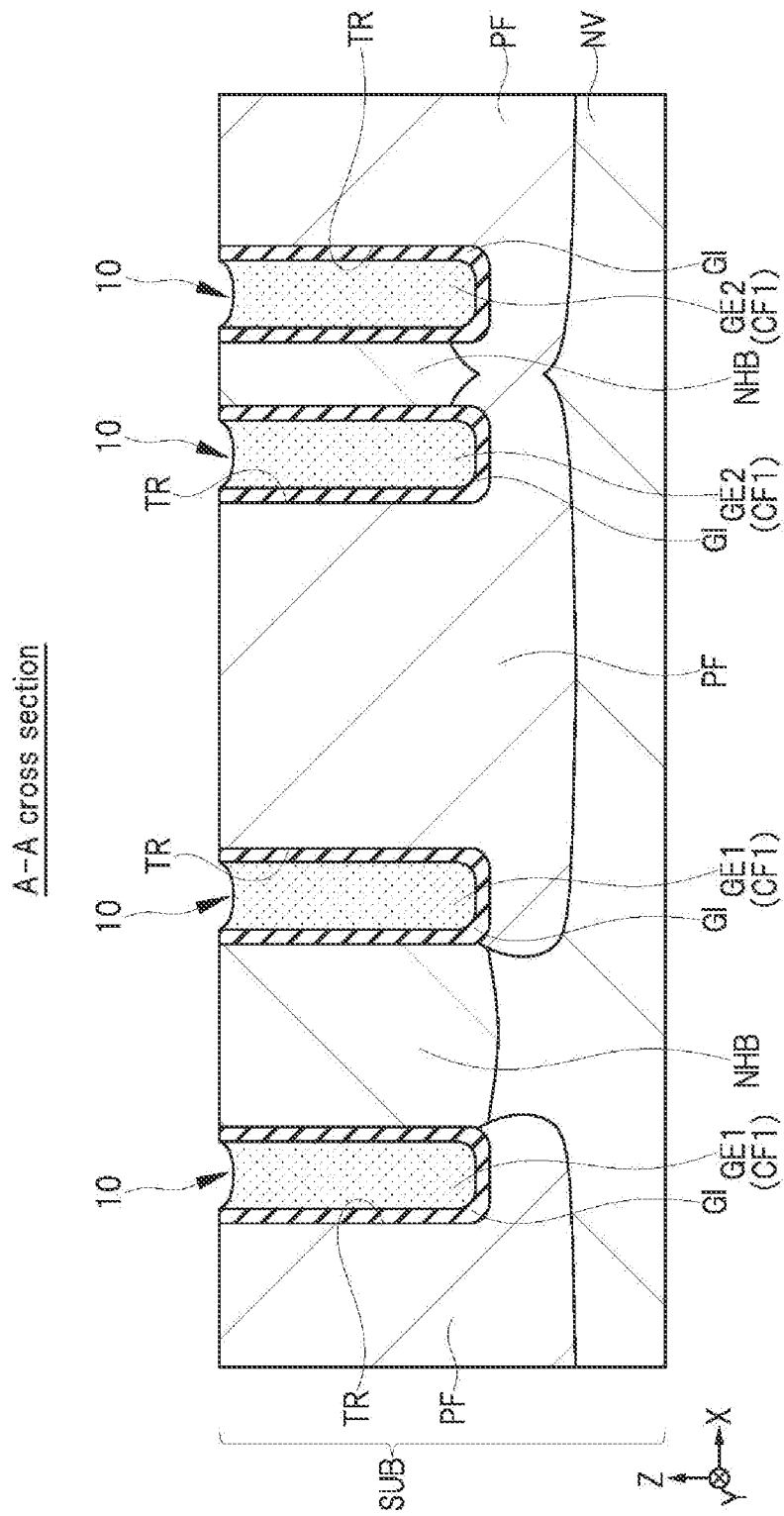
FIG. 7 is a cross-sectional view showing a manufacturing step of the semiconductor device performed after the step shown in FIG. 6.

As shown in FIG. 7, the gate electrodes GE1 and GE2 are formed inside the trench TR through the gate dielectric film GI.

First, the conductive film CF1 formed outside the trench TR is removed by the anisotropic etching. The conductive film CF1 formed inside the trench TR remains as the gate electrodes GE1 and GE2. In order to completely remove the conductive film CF1 outside the trench TR, the anisotropic etching is performed by over-etching. Therefore, a concave portion 10 is formed on an upper surface of each of the gate electrodes GE1 and GE2.

Next, the gate dielectric film GI that had been formed outside the trench TR is removed by an etching process using an isotropic etching, an anisotropic etching, or a combination of these.

Figure 8:
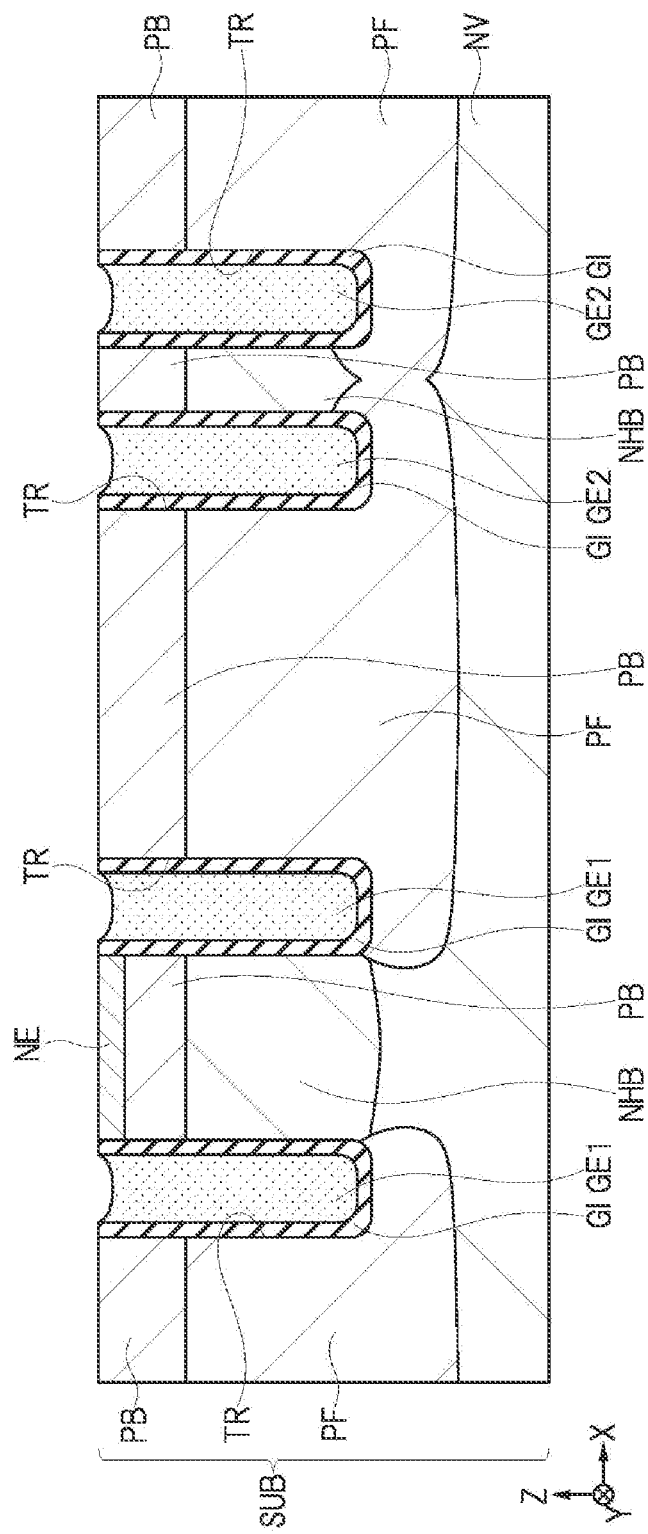
FIG. 8 is a cross-sectional view showing a manufacturing step of the semiconductor device performed after the step shown in FIG. 7.

As shown in FIG. 8, on the upper surface of the semiconductor substrate SUB, the p-type base region PB is formed in the semiconductor substrate SUB (floating region PF and hole barrier region NHB) by photolithography technology and ion-implantation method. Next, the n-type emitter region NE is formed in the base region PB by photolithography technology and ion-implantation method. Afterwards, a heat treatment is performed on the semiconductor substrate SUB to activate the impurities contained in each impurity region.

As a result, the semiconductor elements (in this case, most of the IGBT) is formed on the semiconductor substrate SUB.

Figure 9:
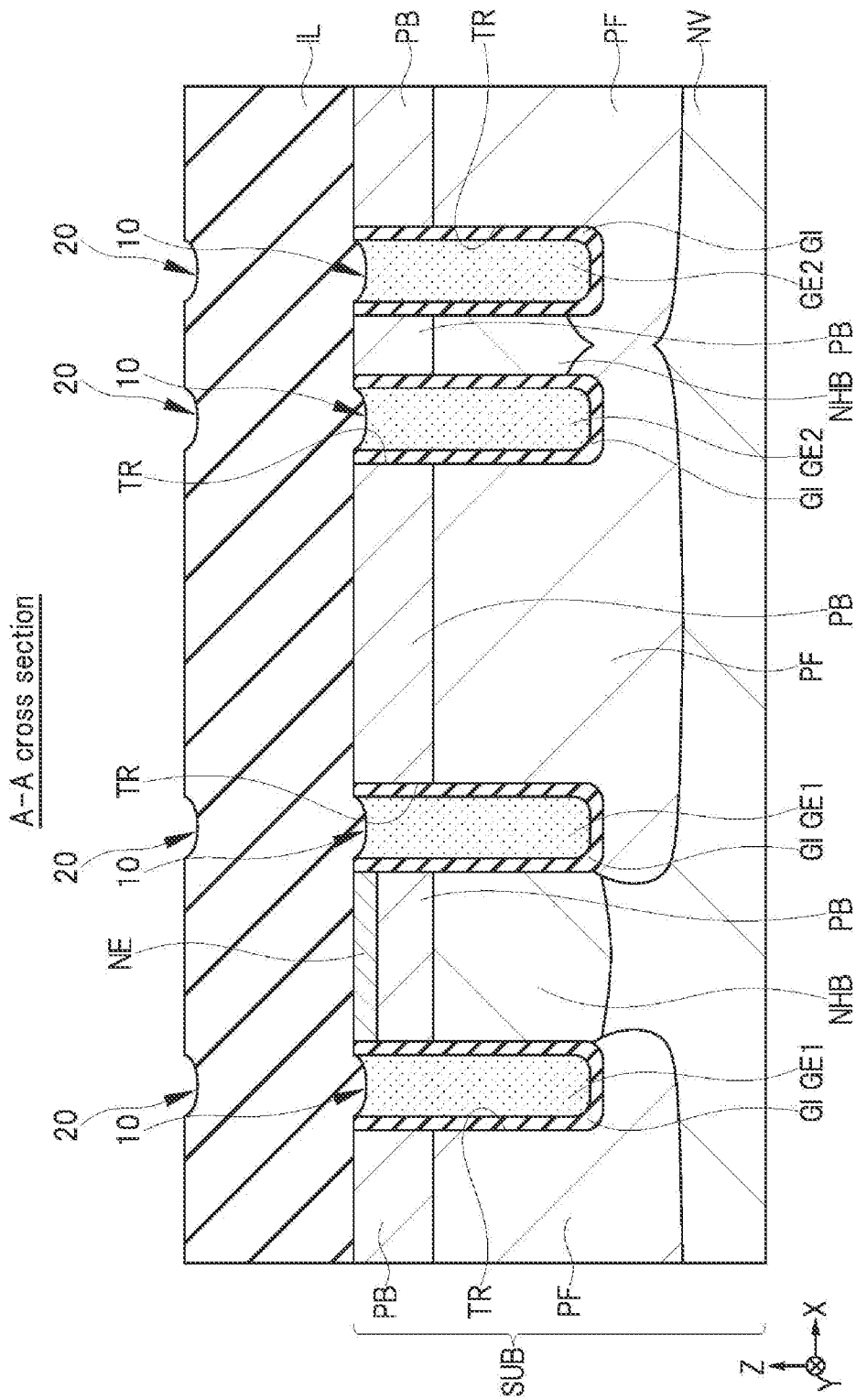
FIG. 9 is a cross-sectional view showing a manufacturing step of the semiconductor device performed after the step shown in FIG. 8.

As shown in FIG. 9, the interlayer insulating film IL is formed on the upper surface of the semiconductor substrate SUB, for example, by the CVD (Chemical Vapor Deposition) method, so as to cover the semiconductor elements. The interlayer insulating film IL is a silicon oxide film that does not contain impurities, for example, a TEOS (Tetra ethoxy silane) oxide film. In the formation by the CVD method, the interlayer insulating film IL is likely to be deposited almost uniformly along the shape of the substrate. Therefore, a concave portion 20 is formed on an upper surface of the interlayer insulating film IL directly above the concave portion 10 on the upper surfaces of each of the gate electrodes GE1 and GE2.

(Examined Example and its Problems)

Figure 33:
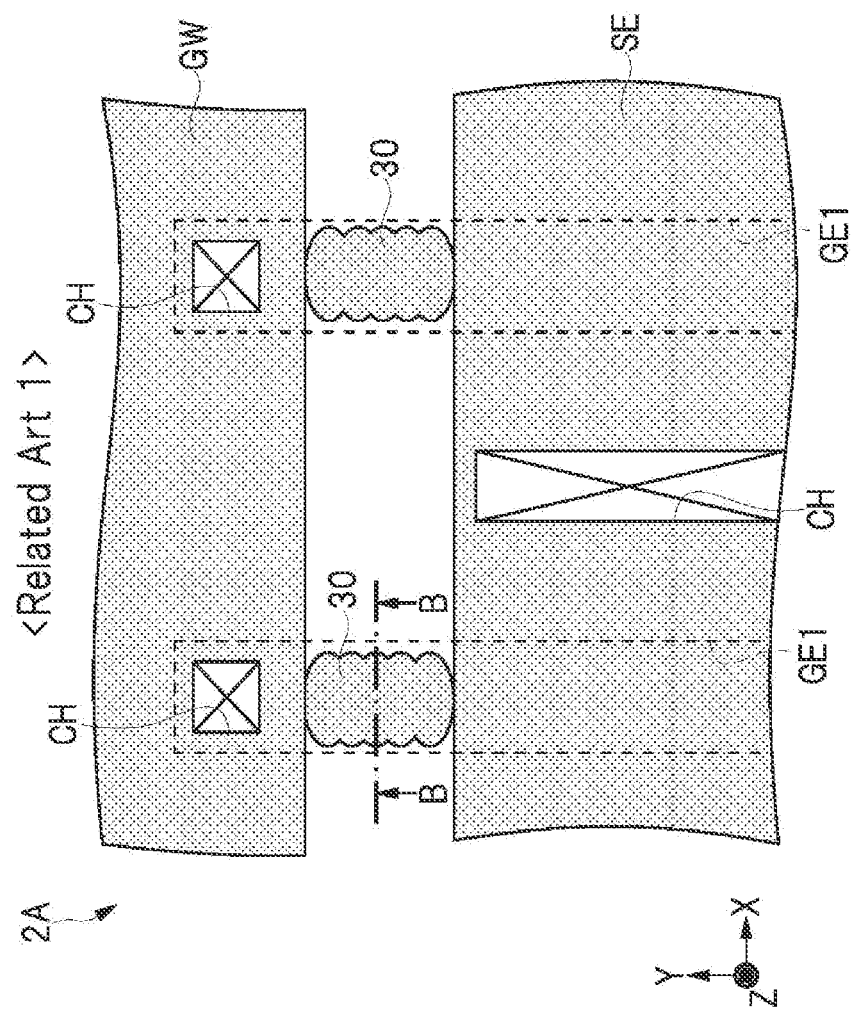
FIG. 33 is a main portion plan view showing the semiconductor device according to a first modified example.
Figure 34:
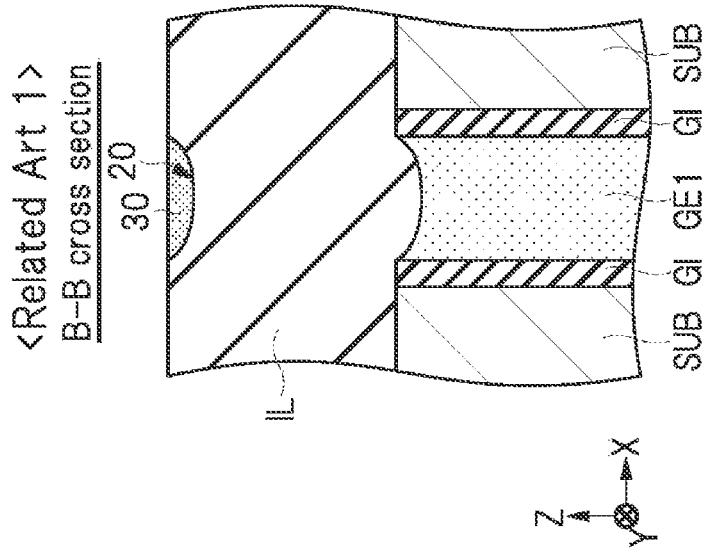
FIG. 34 is a main portion plan view showing the semiconductor device according to the first modified example.
Figure 35:
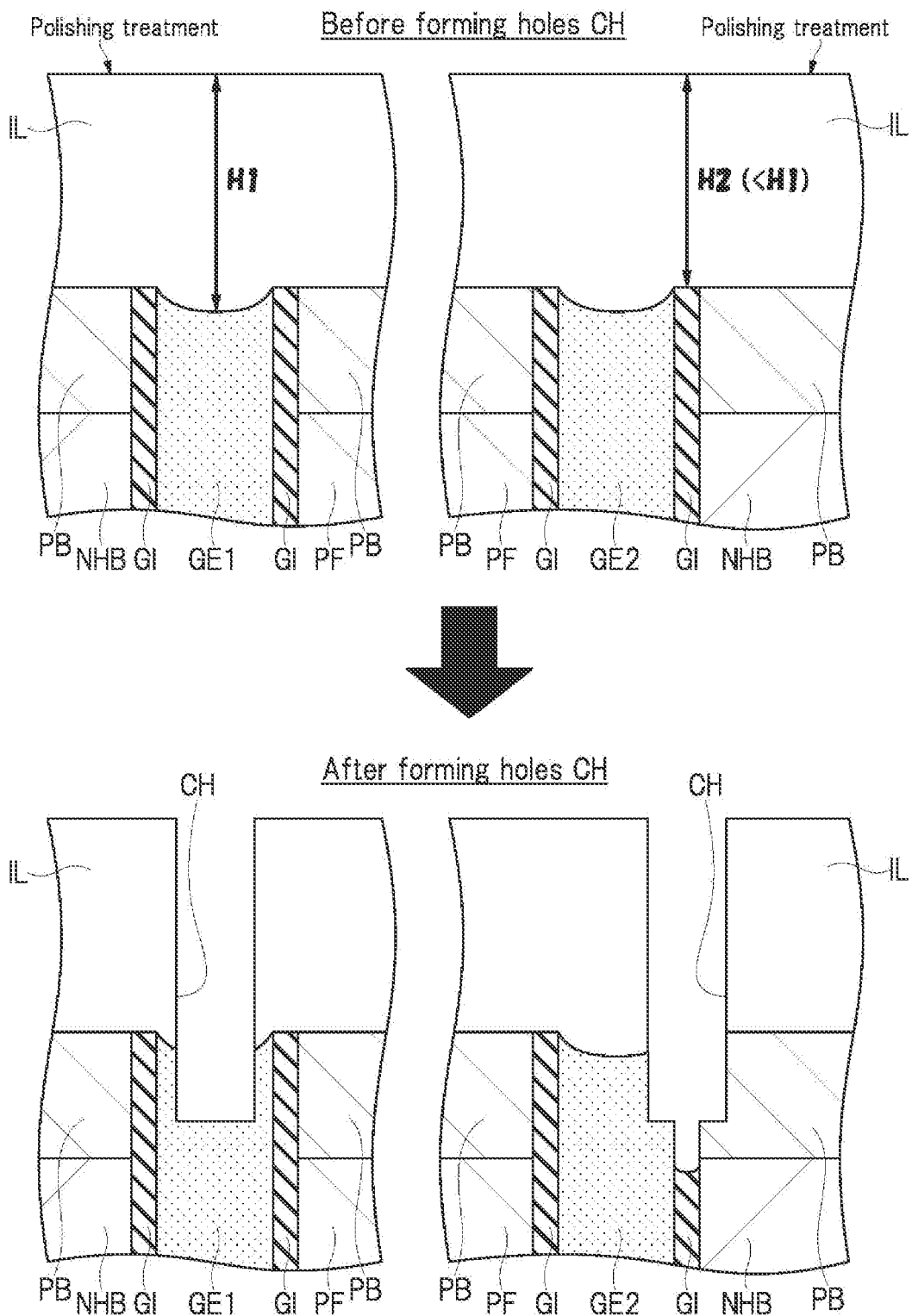
FIG. 35 is a main portion plan view showing the semiconductor device according to a second modified example.

The semiconductor device of the examined example studied by the inventors of this application will be described below using FIGS. 33 to 35. FIGS. 33 and 34 show the semiconductor device of Examined Example 1. FIG. 33 is a plan view showing the outer peripheral region 2A of FIG. 1. FIG. 34 is a cross-sectional view taken along line B-B of FIG. 33. The gate electrode GE1 is electrically connected to the gate wiring GW through the contact hole CH. FIG. 35 shows the semiconductor device of Examined Example 2.

As will be described later, after the manufacturing process of FIG. 9, the contact hole CH is formed in the interlayer insulating film IL, and a conductive film CF2 is formed inside the contact hole CH and on the interlayer insulating film IL. By removing the conductive film CF2 on the interlayer insulating film IL by polishing with a CMP (Chemical Mechanical Polishing) method, the plug PG is formed inside the contact hole CH. Afterwards, the emitter electrode EE and the gate wiring GW are formed on the interlayer insulating film IL.

Here, as shown in FIG. 34, when the concave portion 20 is formed on the upper surface of the interlayer insulating film IL, there is a possibility that a residue 30 of the conductive film CF2 remains in the concave portion 20 when the conductive film CF2 is removed by polishing. As shown in FIG. 33, if such a residue 30 exists between the wirings, such as between the emitter electrode EE and the gate wiring GW, the residue 30 functions as a leak path and becomes a cause of short-circuit failure. In other words, the reliability of the semiconductor device 100 decreases.

It is conceivable to extend the polishing time to remove the residue 30 and also to grind the interlayer insulating film IL to a position corresponding to a depth of the concave portion 20. However, generally, in a polishing of the conductive film CF2, a polishing rate of the interlayer insulating film IL (silicon oxide film) is lower than that of the conductive film CF2. In other words, it is harder to grind the interlayer insulating film IL than the conductive film CF2.

Therefore, if the polishing time is extended too much, problems such as an upper surface of the plug PG sinking due to dishing, or the uniformity of the thickness of the interlayer insulating film IL deteriorating due to erosion, occur.

In response to such problems, it is conceivable to perform a polishing on the interlayer insulating film IL immediately after forming the interlayer insulating film IL (immediately after FIG. 9) by the CMP method and to flatten the upper surface of the interlayer insulating film IL. However, generally, the polishing by the CMP method is expensive, and the manufacturing cost increases.

Furthermore, in the semiconductor device 100 equipped with an IGBT like the first embodiment, a problem as shown in FIG. 35 occurs when the polishing is performed on the interlayer insulating film IL.

As shown in FIG. 35, when the polishing is performed on the interlayer insulating film IL and the upper surface of the interlayer insulating film IL is flattened, the height H2 from the upper surface of the interlayer insulating film IL to the gate dielectric film GI in contact with the gate electrode GE2 becomes lower than the height H1 from the upper surface of the interlayer insulating film IL to the gate electrode GE1.

The contact hole CH reaching the gate electrode GE1, the contact hole CH reaching the gate electrode GE2, and the semiconductor substrate SUB are formed by the same manufacturing process. Therefore, the etching process for forming the contact hole CH is performed to at least a depth corresponding to the height H1. However, on the gate electrode GE2, after the etching process has progressed to a depth corresponding to the height H2, the gate dielectric film GI will be etched.

As a result, there is a problem that the gate dielectric film GI in contact with the gate electrode GE2 excessively recedes. Then, there is a risk of short-circuit failure occurring because the conductive film CF2 is formed at the location where the gate dielectric film GI has receded, and the gate electrode GE2, the base region PB, and the hole barrier region NHB are electrically connected via the conductive film CF2.

In response to these problems, in the first embodiment, the polishing by the CMP method is not performed immediately after forming the interlayer insulating film IL. Although this makes it difficult to remove the residue 30, in the first embodiment, as a countermeasure, the first implantation layer IM1 is formed in the interlayer insulating film IL by high-concentration ion-implantation.

(Formation of Implantation Layer by High-Concentration Ion-Implantation)

Figure 10:
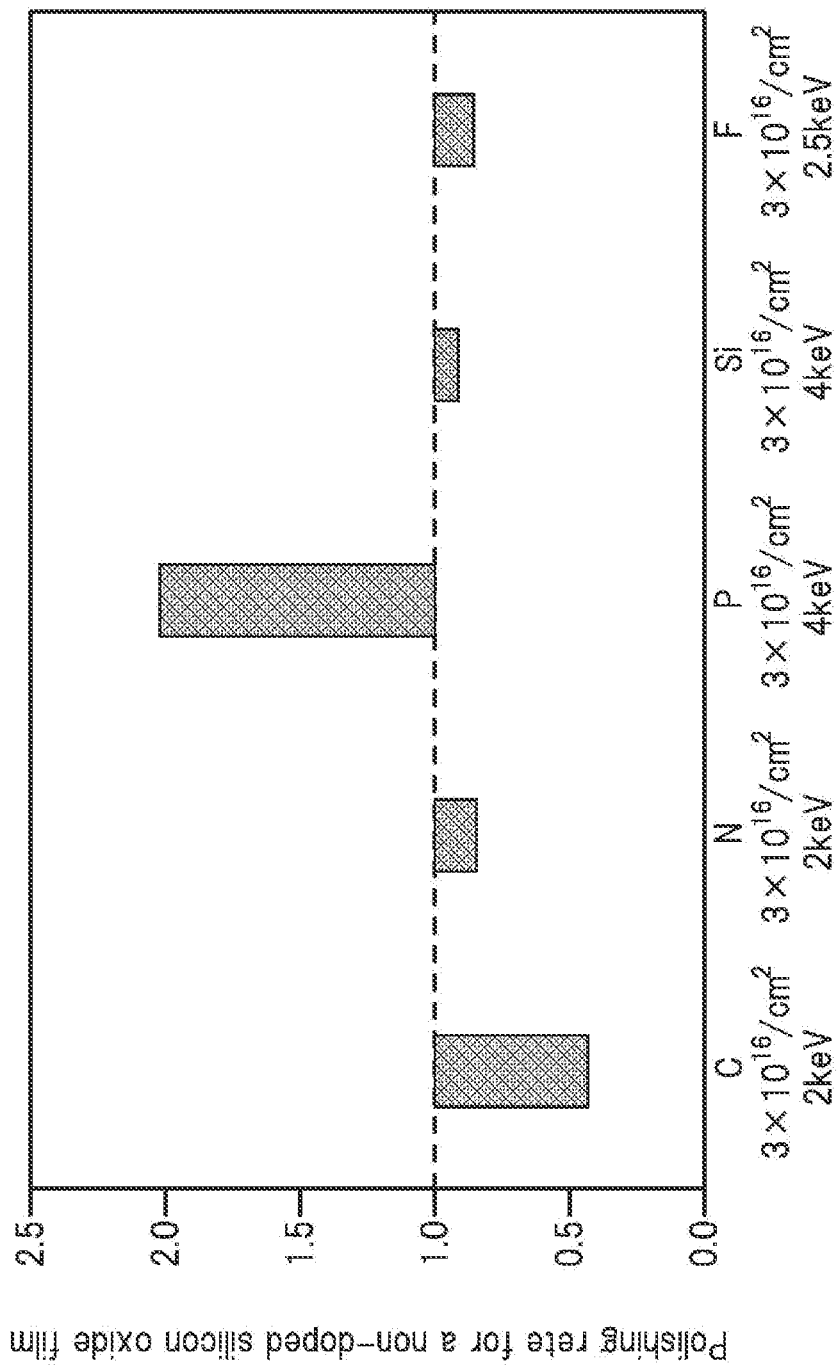
FIG. 10 is a graph showing the relationship between ion-implantation conditions and polishing rate.

FIG. 10 is a graph showing data obtained by the inventors of this application through experiments. FIG. 10 shows the relationship between the conditions of ion-implantation for forming the first implantation layer IM1 and a second implantation layer IM2, and a polishing rate of the polishing performed at the time of forming the plug PG. In FIG. 10, the polishing rate of the silicon oxide film (non-doped $SiO_2$ film) without ion-implantation is taken as the reference value (1.0).

The data shown in FIG. 10 is not a known finding, but a new finding discovered by the inventors of this application.

As shown in FIG. 10, ion-implantation is performed on the silicon oxide film using carbon (C), nitrogen (N), phosphorus (P), silicon (Si), or fluorine (F) as an ion species, and a dose amount of these is set to $1 \times 10^{16}$ cm$^{-2}$ or more. More specifically, ion-implantation was performed with the dose amount and implantation energy of each ion species as the conditions shown in FIG. 10. As a result, the inventors of this application found that the physical properties of the silicon oxide film change and the polishing rate of the polishing changes.

For example, when the ion species is phosphorus (P), the polishing rate becomes higher than that of the non-doped $SiO_2$ film. Also, when the ion species is carbon (C), nitrogen (N), silicon (Si), or fluorine (F), the polishing rate becomes lower than that of the non-doped $SiO_2$ film. By utilizing these differences in polishing rates, it becomes easier to remove the residue 30 and also to shave the interlayer insulating film IL down to a depth corresponding to the depth of the concave portion 20.

Figure 11:
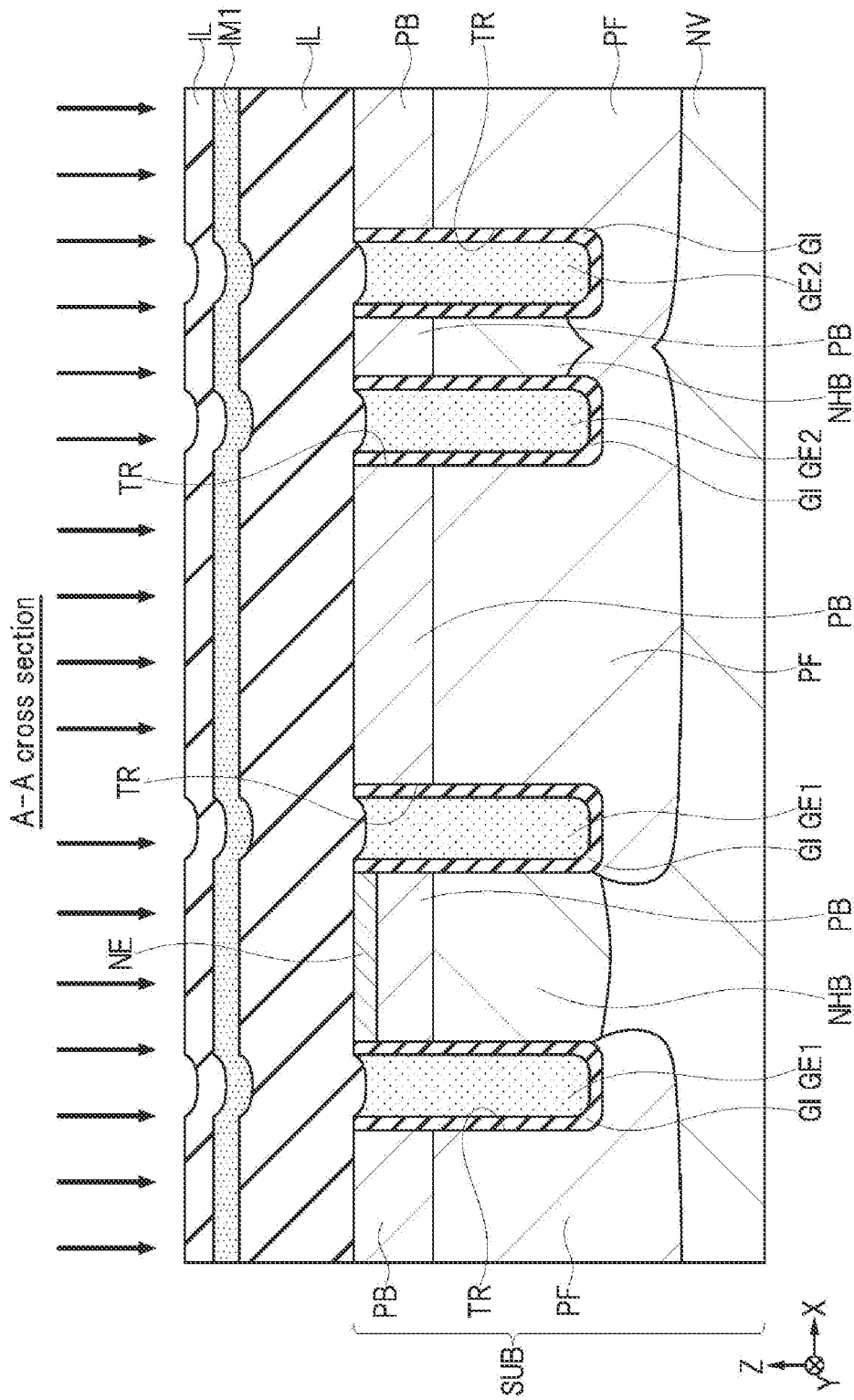
FIG. 11 is a cross-sectional view showing a manufacturing step of the semiconductor device performed after the step shown in FIG. 9.

FIG. 11 shows the manufacturing process following FIG. 9. As shown in FIG. 11, the first implantation layer IM1 is formed in the interlayer insulating film IL by ion-implantation. This ion-implantation is performed using phosphorus (P) as the ion species and under conditions where the dose amount is $1 \times 10^{16}$ cm$^{-2}$ or more. Here, the dose amount is $3 \times 10^{16}$ cm$^{-2}$. This ion-implantation is performed by vertical ion-implantation. In other words, this ion-implantation is performed from the direction (Z direction) along the perpendicular to the upper surface of the semiconductor substrate SUB. By this ion-implantation, a laminated film consisting of a bottom interlayer insulating film IL1, the first implantation layer IM1 and an upper interlayer insulating film IL2 is formed.

Furthermore, the first implantation layer IM1 is formed so that a thickness of the first implantation layer IM1 is thicker than the depth of the concave portion 20. The thickness of the first implantation layer IM1 is, for example, 15 nm or more and 30 nm or less. In addition, the implantation layer IM1 is formed inside the interlayer insulating film IL so as not to be exposed on the upper surface of the interlayer insulating film IL. To form such the first implantation layer IM1, the implantation energy of the above-mentioned ion-implantation is, for example, 3 keV or more and 6 keV or less.

Figure 12:
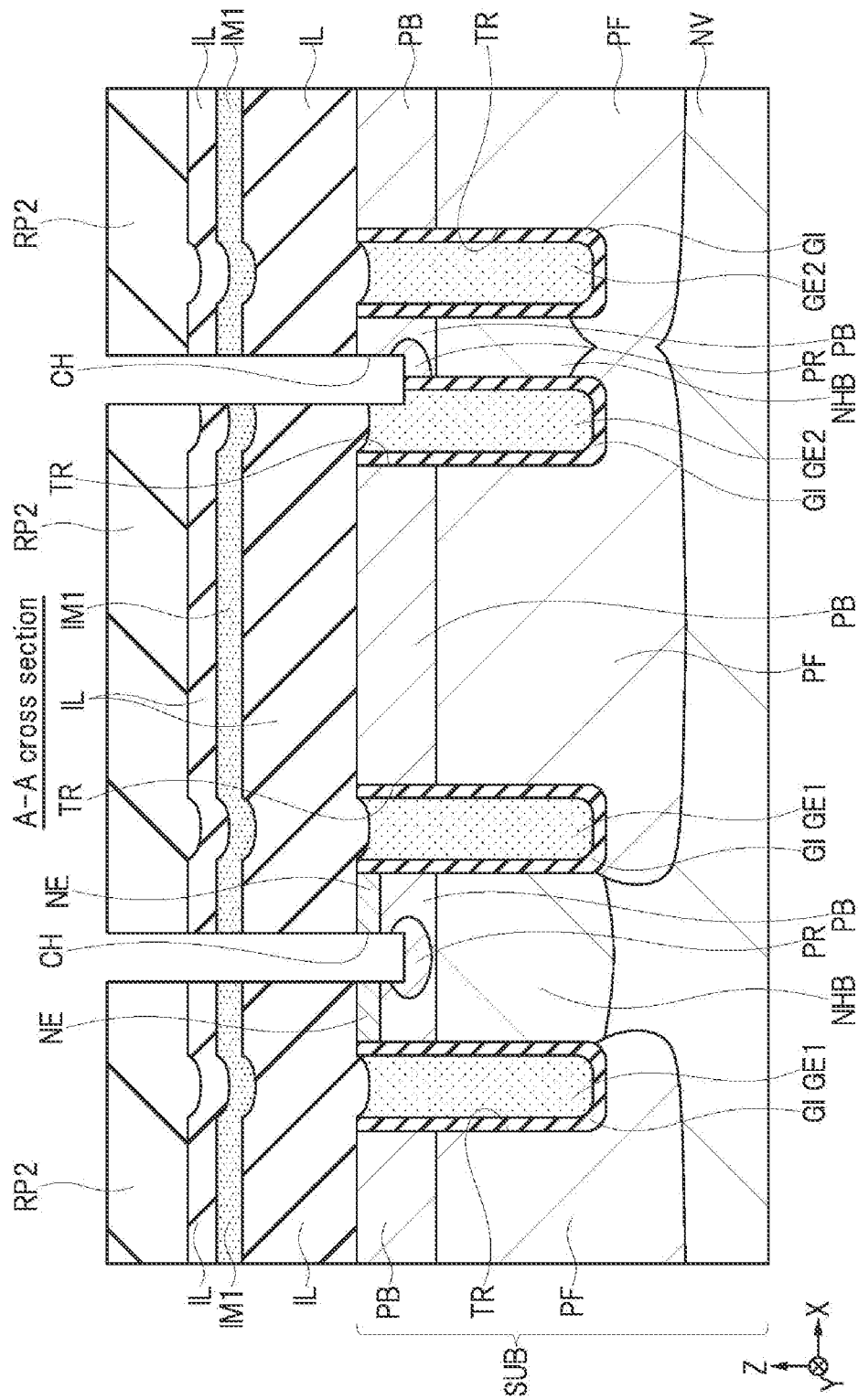
FIG. 12 is a cross-sectional view showing a manufacturing step of the semiconductor device performed after the step shown in FIG. 11.

As shown in FIG. 12, a plurality of holes CH are formed in the laminated film, and the high concentration diffusion region PR is formed in the base region PB.

First, a resist pattern RP2 is formed on the upper interlayer insulating film IL2. Then, by performing an anisotropic etching using the resist pattern RP2 as a mask, a plurality of holes CH are formed in the laminated film so as to reach a position lower than the position of the upper surface of the semiconductor substrate e SUB. Then, by ion-implantation, the p-type high concentration diffusion region PR is formed in the base region PB at the bottom of each of the plurality of holes CH. Thereafter, the resist pattern RP2 is removed by an ashing process.

The contact hole CH of the active cell AC penetrates the upper interlayer insulating film IL2, the first implantation layer IM1, the bottom interlayer insulating film IL1 and the emitter region NE, and reaches inside the base region PB. The contact hole CH of the inactive cell IAC penetrates the upper interlayer insulating film IL2, the first implantation layer IM1, the bottom interlayer insulating film IL1, and reaches inside the gate electrode GE2, the gate dielectric film GI, and the semiconductor substrate SUB (inside the base region PB). In addition, although not shown here, some of the holes CH are formed to penetrate the upper interlayer insulating film IL2, the first implantation layer IM1, the bottom interlayer insulating film IL1, and reach the gate electrode GE1 (see the outer peripheral region 2A in FIG. 33).

Figure 13:
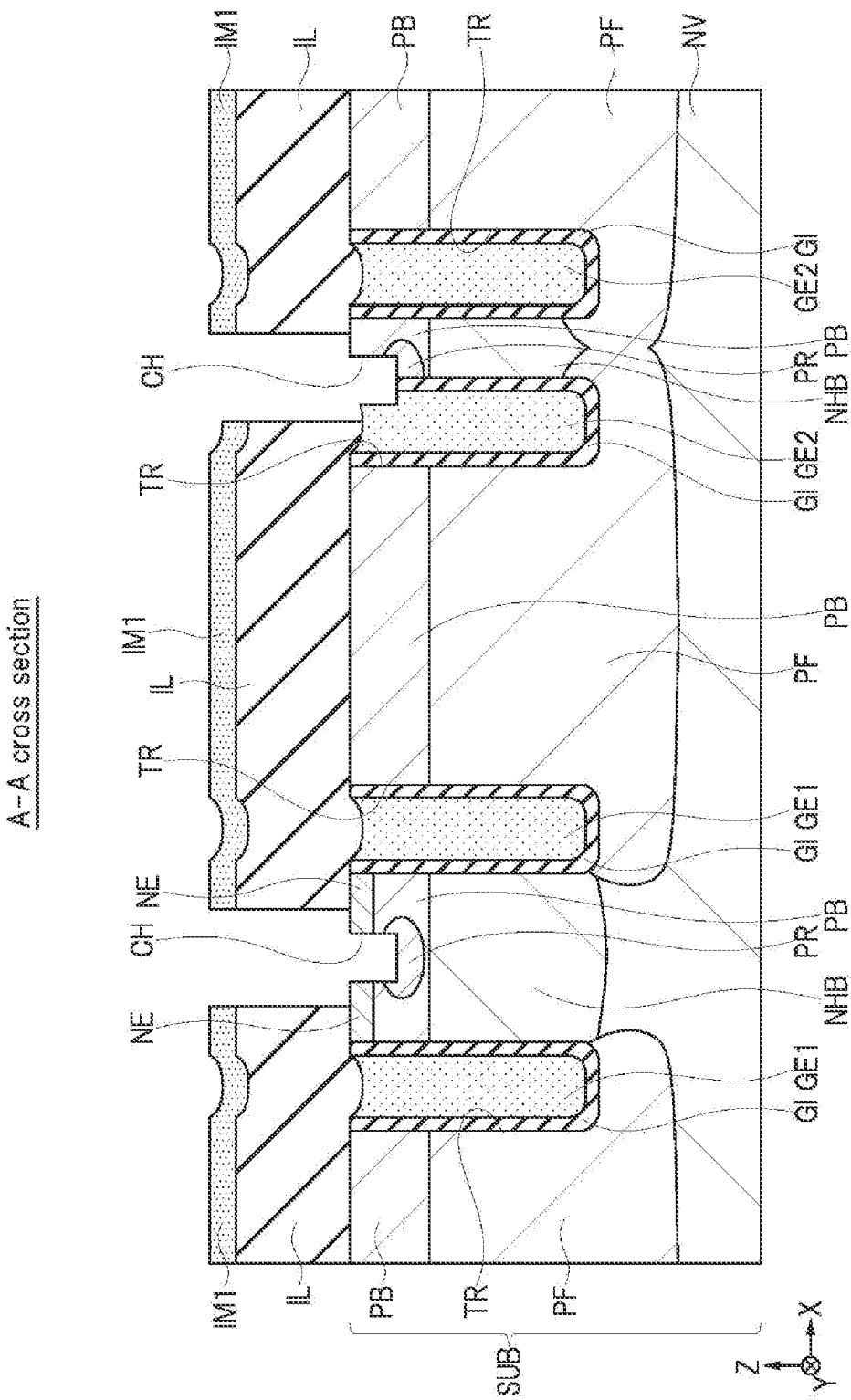
FIG. 13 is a cross-sectional view showing a manufacturing step of the semiconductor device performed after the step shown in FIG. 12.

As shown in FIG. 13, the laminated film is retreated by an isotropic etching using a solution containing, for example, hydrofluoric acid. As a result, not only does the upper surface of the laminated film retreat, but the side surface of the laminated film inside the holes CH also retreat. That is, an opening width of the contact hole CH located above the position of the upper surface of the semiconductor substrate SUB becomes wider than the opening width of the contact hole CH located below the position of the upper surface of the semiconductor substrate SUB.

As a result, in the active cell AC, a part of an upper surface of the emitter region NE is exposed, and in the inactive cell IAC, a part of the upper surface of the gate electrode GE2 is exposed. The emitter region NE and the gate electrode GE2 not only contact the plug PG at their side surface, but also contact the plug PG at their upper surface. Therefore, the contact-resistance with the plug PG can be reduced.

Note that by this isotropic etching, the upper interlayer insulating film IL2 that had been formed on the first implantation layer IM1 is removed. At this time, it is preferable that the first implantation layer IM1 is exposed.

Figure 14:
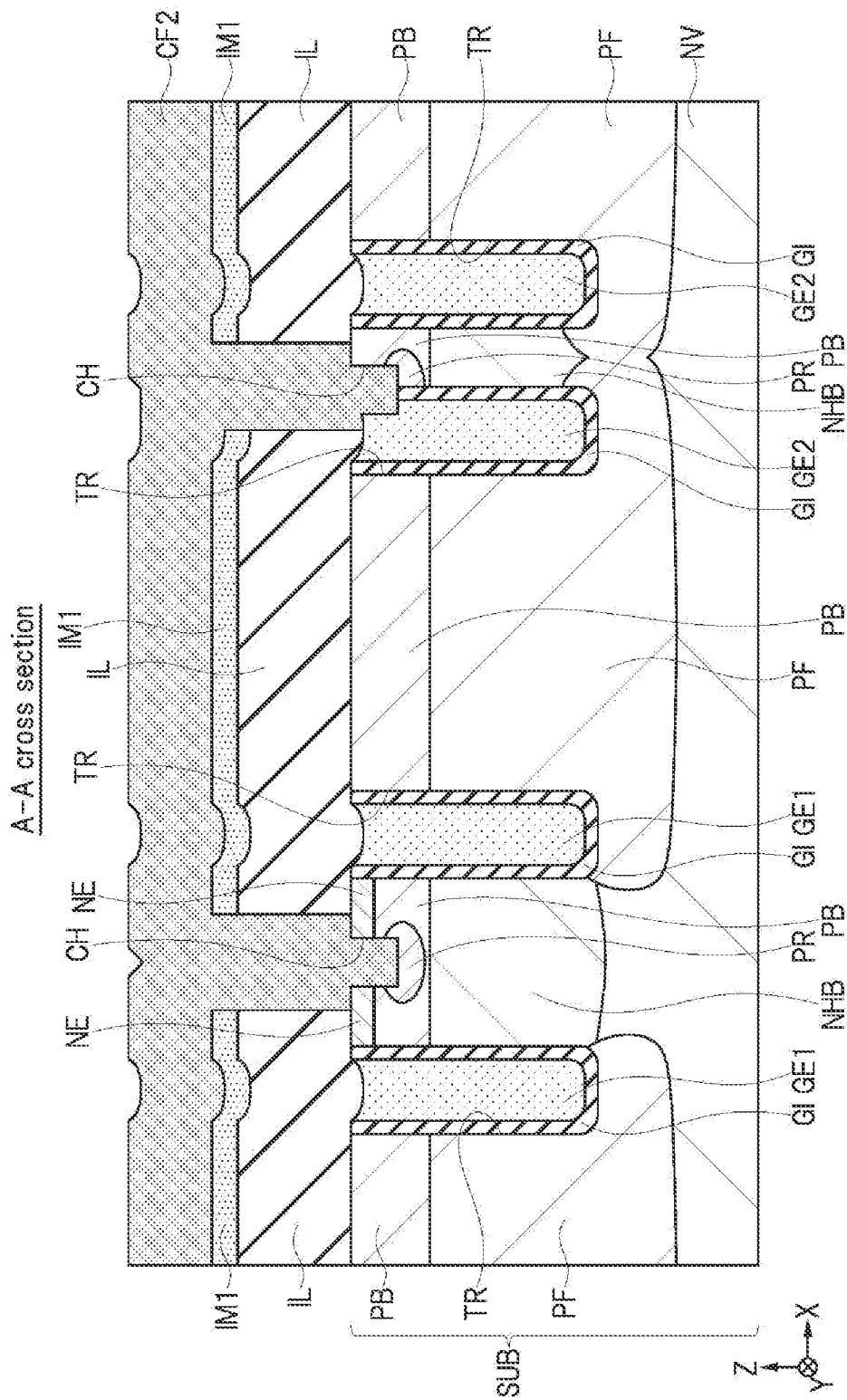
FIG. 14 is a cross-sectional view showing a manufacturing step of the semiconductor device performed after the step shown in FIG. 13.

As shown in FIG. 14, the conductive film CF2 is formed on the first implantation layer IM1 to fill the inside of the holes CH.

First, the barrier metal film is formed inside the holes CH and on the first implantation layer IM1. For example, a titanium film can be formed inside the holes CH and on the first implantation layer IM1 by sputtering, and a titanium nitride film can be formed on the titanium film by sputtering to form the barrier metal film. Then, for example, by CVD, a main conductive film made of, for example, tungsten is formed on the barrier metal film so as to fill the inside of the holes CH. This laminated film including the barrier metal film and the main conductive film constitute the conductive film CF2.

Figure 15:
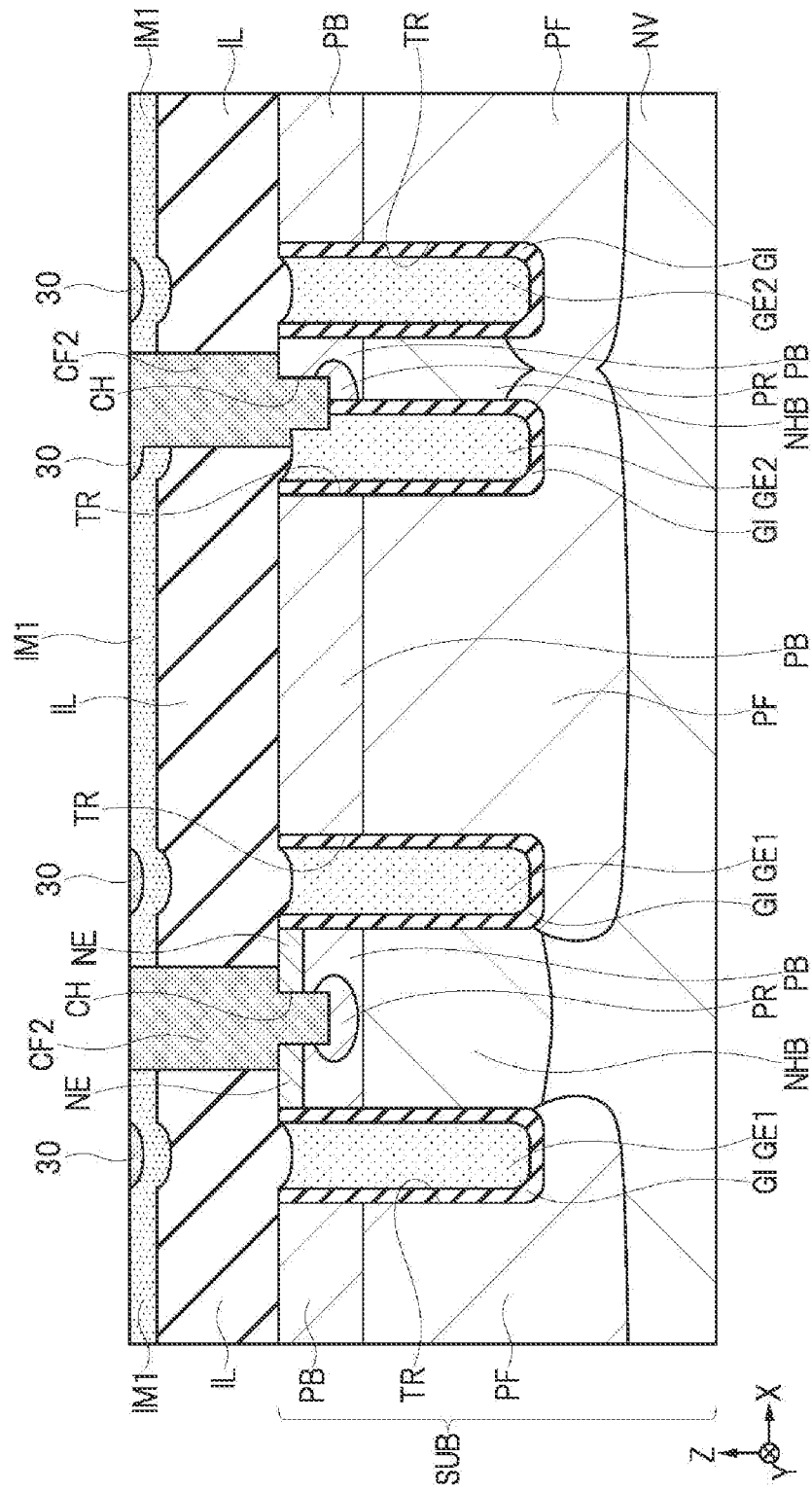
FIG. 15 is a cross-sectional view showing a manufacturing step of the semiconductor device performed after the step shown in FIG. 14.

As shown in FIG. 15, the conductive film CF2 outside the holes CH is removed by polishing by CMP so that the conductive film CF2 inside the holes CH remains. Note that this polishing is performed under conditions where the conductive film CF2 and the first implantation layer IM1 are more easily polished compared to the bottom interlayer insulating film IL1.

At the point when the polishing reaches the first implantation layer IM1, residue 30 exists in the areas where the shape of the concave portion 20 is reflected. Therefore, in order to remove the residue 30, the time of the polishing is extended, and the polishing is also performed on the first implantation layer IM1.

As mentioned above, in this polishing, the polishing rate of the first implantation layer IM1 is different from the polishing rate of the bottom interlayer insulating film IL1, and is higher than the polishing rate of the bottom interlayer insulating film IL1. In other words, the first implantation layer IM1 is easily abraded.

Figure 16:
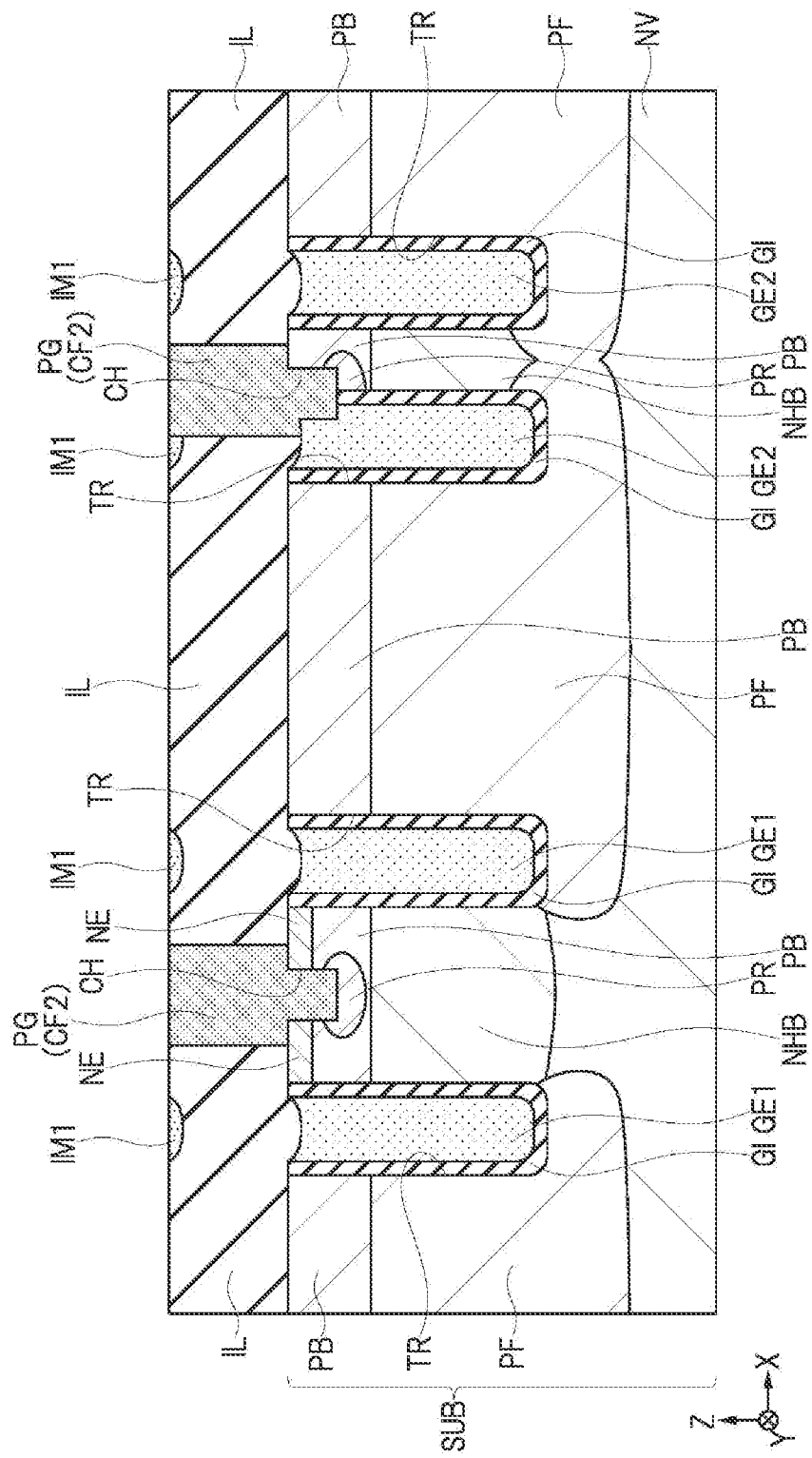
FIG. 16 is a cross-sectional view showing a manufacturing step of the semiconductor device performed after the step shown in FIG. 15.

Therefore, as shown in FIG. 16, in this polishing, the first implantation layer IM1 is polished, but the residue 30 and the first implantation layer IM1 can be removed in a relatively short time. At this time, the bottom interlayer insulating film IL1 has a relatively low polishing rate, so this bottom interlayer insulating film IL1 functions as a polishing stopper. Therefore, it becomes easy to detect the end point of the polishing.

In addition, since the first implantation layer IM1 was formed so that the thickness of the first implantation layer IM1 is thicker than the depth of the concave portion 20, when the first implantation layer IM1 is removed and the bottom interlayer insulating film IL1 is exposed, the residue 30 is surely removed. Also, the first implantation layer IM1 remains in the areas where the shape of the concave portion 20 is reflected.

In this way, the residue 30 of the conductive film CF2 can be removed, and the plug PG made of the conductive film CF2 can be formed inside the contact hole CH. By removing the residue 30, the problem that was concerned in the examined example 1 can be solved. That is, the first implantation layer IM1 remains in the part of the bottom interlayer insulating film IL1 corresponding to the place where the concave portion 20 was located, but it does not function as a leak path, so it can suppress short defects between each wiring such as between the emitter electrode EE and the gate wiring GW. Therefore, the reliability of the semiconductor device 100 can be improved.

Also, since the polishing rate of the first implantation layer IM1 is high, the residue 30 and the first implantation layer IM1 can be removed in a relatively short time. Therefore, it is possible to suppress the occurrence of dishing or erosion. Also, since the polishing by the CMP method is not performed on the interlayer insulating film IL immediately after forming the interlayer insulating film IL (immediately after FIG. 9), it is possible to suppress the increase in manufacturing cost. Also, it can solve the problem that the gate dielectric film GI in contact with the gate electrode GE2 excessively recedes, as was concerned in the examined example 2.

After that, the structure of FIG. 3 is obtained through the following manufacturing process. First, a TiW film is formed on the bottom interlayer insulating film IL1 by, for example, a sputtering method, and an aluminum alloy film is formed on the TiW film by, for example, a sputtering method. Then, by patterning the TiW film and the aluminum alloy film by photolithography technology and dry etching process, the emitter electrode EE is formed. Note that the gate wiring GW is also formed on the bottom interlayer insulating film IL1 in the same process as the process of forming the emitter electrode EE.

Next, by performing ion-implantation from the bottom surface of the semiconductor substrate SUB, the n-type field stop region NS and a p-type collector region PC are formed. Then, a metal film such as an Au film, Ni film, Ti film or AlSi film is formed under the bottom surface of the semiconductor substrate SUB by, for example, a sputtering method. This metal film becomes the collector electrode CE. The collector electrode CE may be a laminated film obtained by appropriately laminating the above-mentioned metal film.

First Modified Example

Hereinafter, a semiconductor device 100 in the first modified example of the first embodiment will be described using FIG. 17.

In the manufacturing process of FIG. 11, the ion-implantation of the first implantation layer IM1 was performed by vertical ion-implantation, but in the first modified example, the ion-implantation of the first implantation layer IM1 is performed by oblique ion-implantation.

Figure 17:
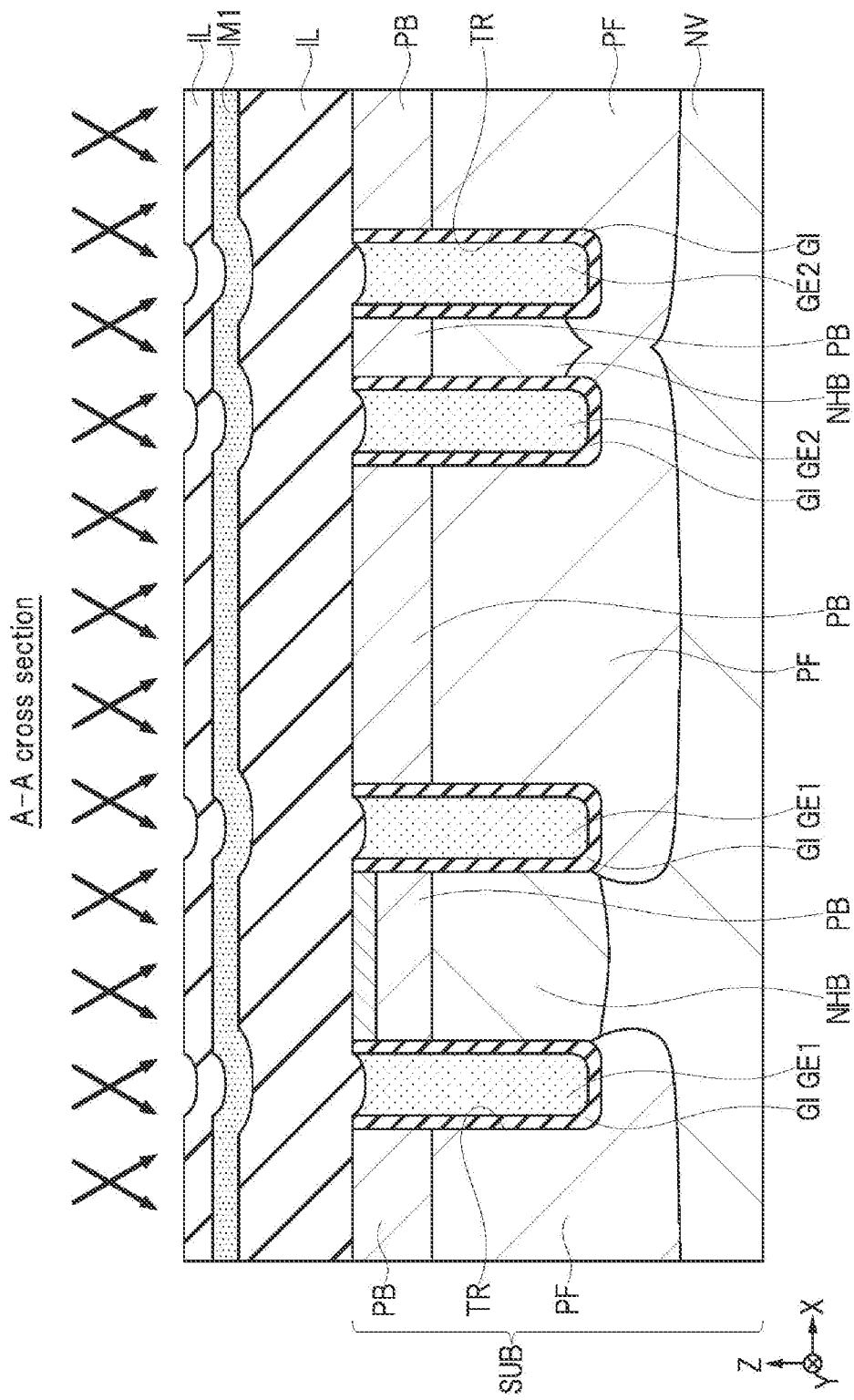
FIG. 17 is a cross-sectional view showing a manufacturing step of the semiconductor device according to a modified example.

FIG. 17 shows a manufacturing process performed instead of the manufacturing process of FIG. 11. As shown in FIG. 17, the ion-implantation of the first implantation layer IM1 is performed at an angle inclined from the perpendicular to the upper surface of the semiconductor substrate SUB. Such an angle is, for example, 20 degrees or more and 40 degrees or less. Note that other conditions related to the ion-implantation of the first implantation layer IM1 are the same as in the first embodiment.

In the case of oblique ion-implantation in the first modified example, compared to the vertical ion-implantation in the first embodiment, the first implantation layer IM1 is more likely to be formed deeply and widely at locations where steps such as the concave portion 20 occur. Therefore, it becomes easier to improve the flatness of the entire interlayer insulating film IL in the polishing.

Note that the oblique ion-implantation of the first modified example can be applied not only to the first embodiment but also to the second, third, and fourth embodiments described later. That is, the oblique ion-implantation of the first modified example can be applied not only to the ion-implantation of the first implantation layer IM1 but also to the ion-implantation of the second implantation layer IM2 described later.

Second Embodiment

Hereinafter, a semiconductor device 100 in the second embodiment will be described using FIGS. 18 to 21. Note that, in the following description, differences from the first embodiment will be mainly described, and the description of overlapping points with the first embodiment will be omitted.

In the first embodiment, the first implantation layer IM1 was formed using phosphorus (P). In the second embodiment, a second implantation layer IM2 is formed using carbon (C). As shown in FIG. 10, when ion-implantation is performed under conditions where carbon (C) is used as an ion species and a dose amount is $1\times10^{16}$ cm$^{-2}$ or more, a polishing rate becomes lower than that of the non-doped $SiO_2$ film.

Figure 18:
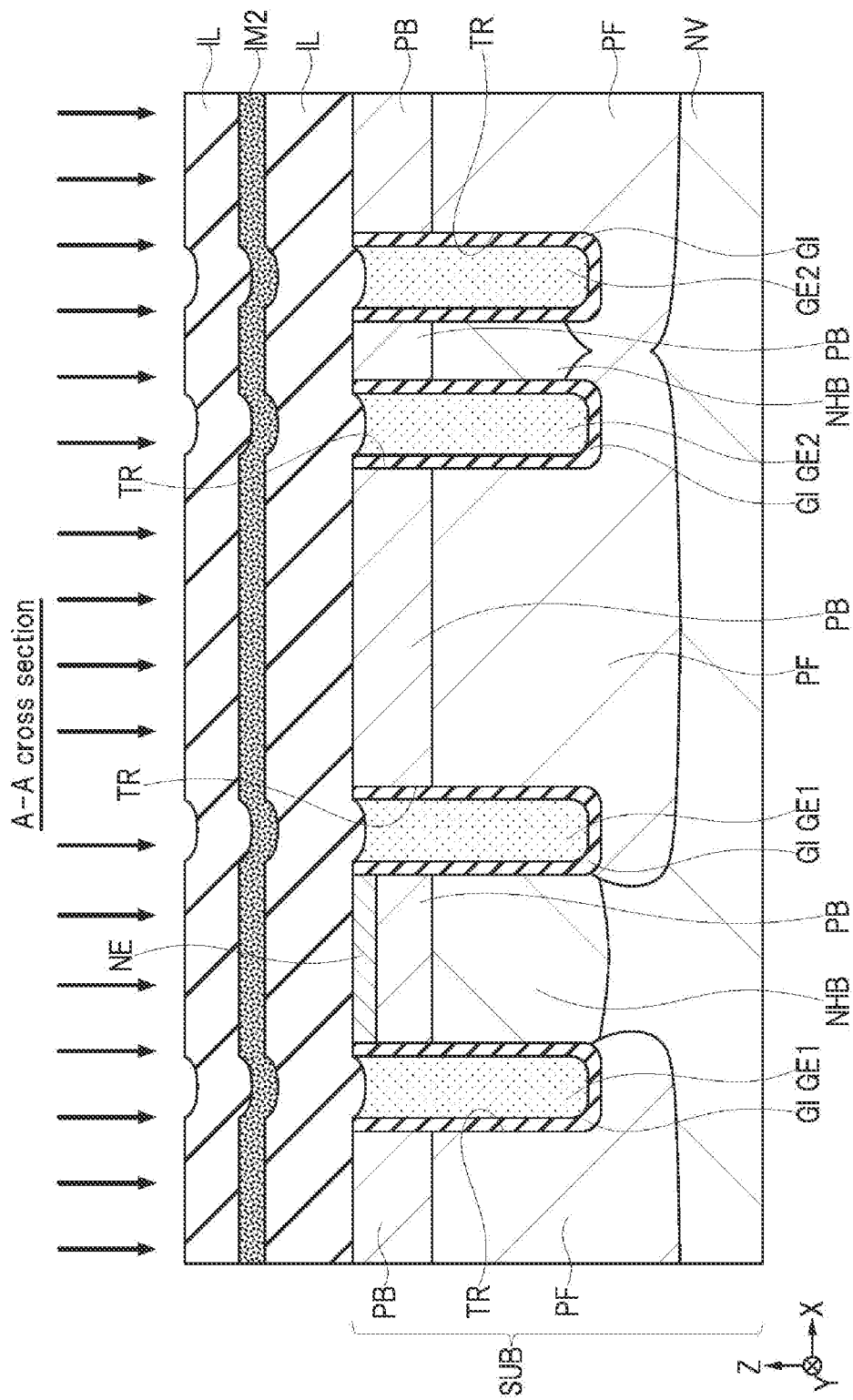
FIG. 18 is a cross-sectional view showing a manufacturing step of a semiconductor device according to a second embodiment.

FIG. 18 shows a manufacturing process following FIG. 9. As shown in FIG. 18, by ion-implantation, the second implantation layer IM2 is formed in the interlayer insulating film IL. This ion-implantation is performed using carbon (C) as the ion species and under conditions where the dose amount is $1\times10^{16}$ cm$^{-2}$ or more. Here, the dose amount is $3\times10^{16}$ cm$^{-2}$. Note that this ion-implantation is performed by vertical ion-implantation. By this ion-implantation, a laminated film consisting of a bottom interlayer insulating film IL1, the second implantation layer IM2 and an upper interlayer insulating film IL2 is formed.

A thickness of the second implantation layer IM2 is, for example, 5 nm or more and 20 nm or less. Furthermore, the second implantation layer IM2 is formed inside the interlayer insulating film IL so as not to be exposed on an upper surface of the interlayer insulating film IL. Note that the second implantation layer IM2 is formed at a deeper position than the first implantation layer IM1 of the first embodiment. To form such the second implantation layer IM2, the implantation energy of the above-mentioned ion-implantation is, for example, 2 keV or more and 8 keV or less.

Figure 19:
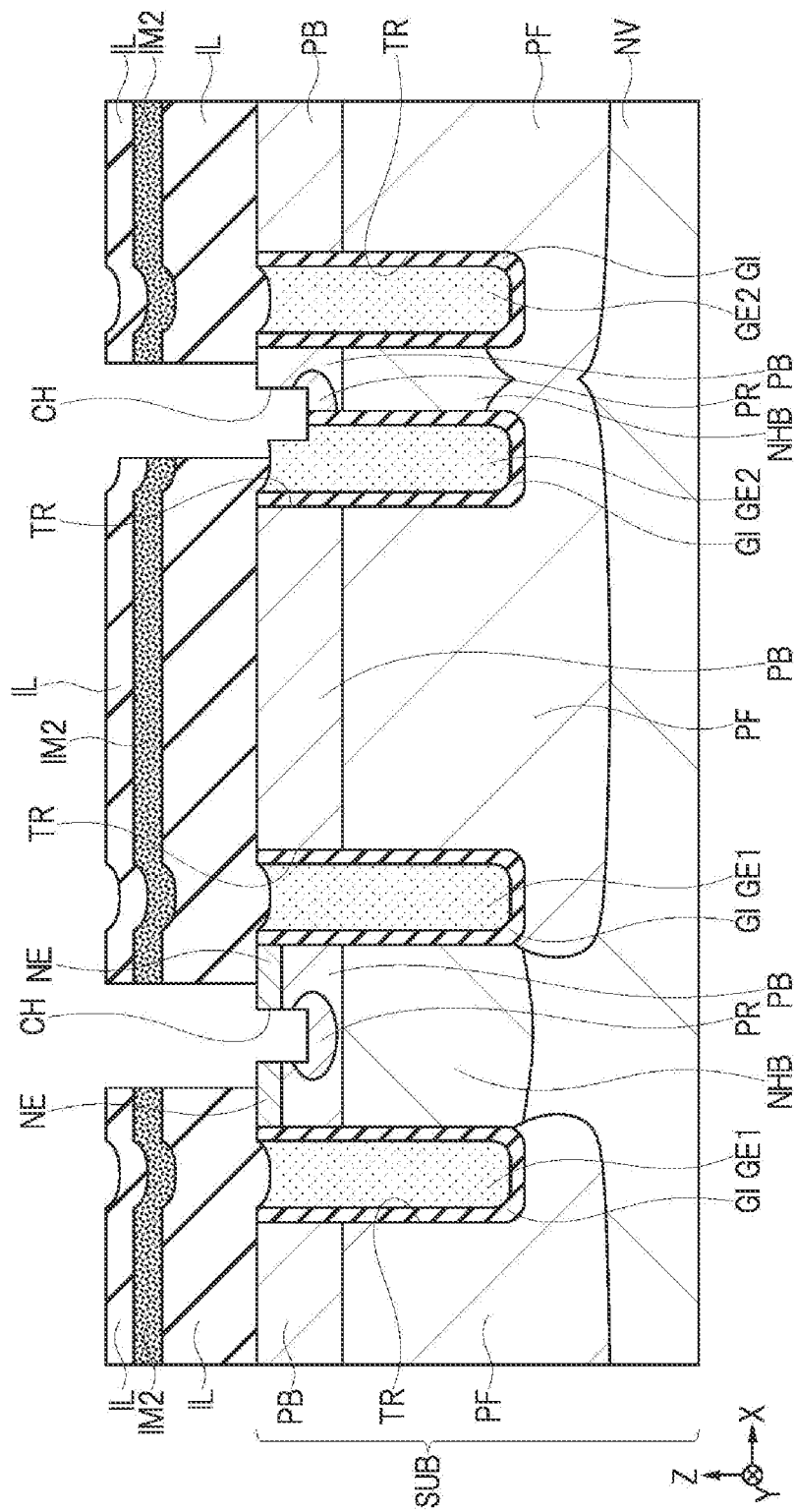
FIG. 19 is a cross-sectional view showing a manufacturing step of the semiconductor device performed after the step shown in FIG. 18.

As shown in FIG. 19, first, a plurality of holes CH are formed in the laminated film. Then, a p-type high concentration diffusion region PR is formed at the bottom of each of the plurality of holes CH. The manufacturing process for forming each of the plurality of holes CH and the high concentration diffusion region PR is the same as in the first embodiment.

Next, as in the first embodiment, the laminated film is retreated by an isotropic etching using a solution containing, for example, hydrofluoric acid. By this isotropic etching, the upper interlayer insulating: film IL2 becomes thin, but the second implantation layer IM2 does not expose.

Figure 20:
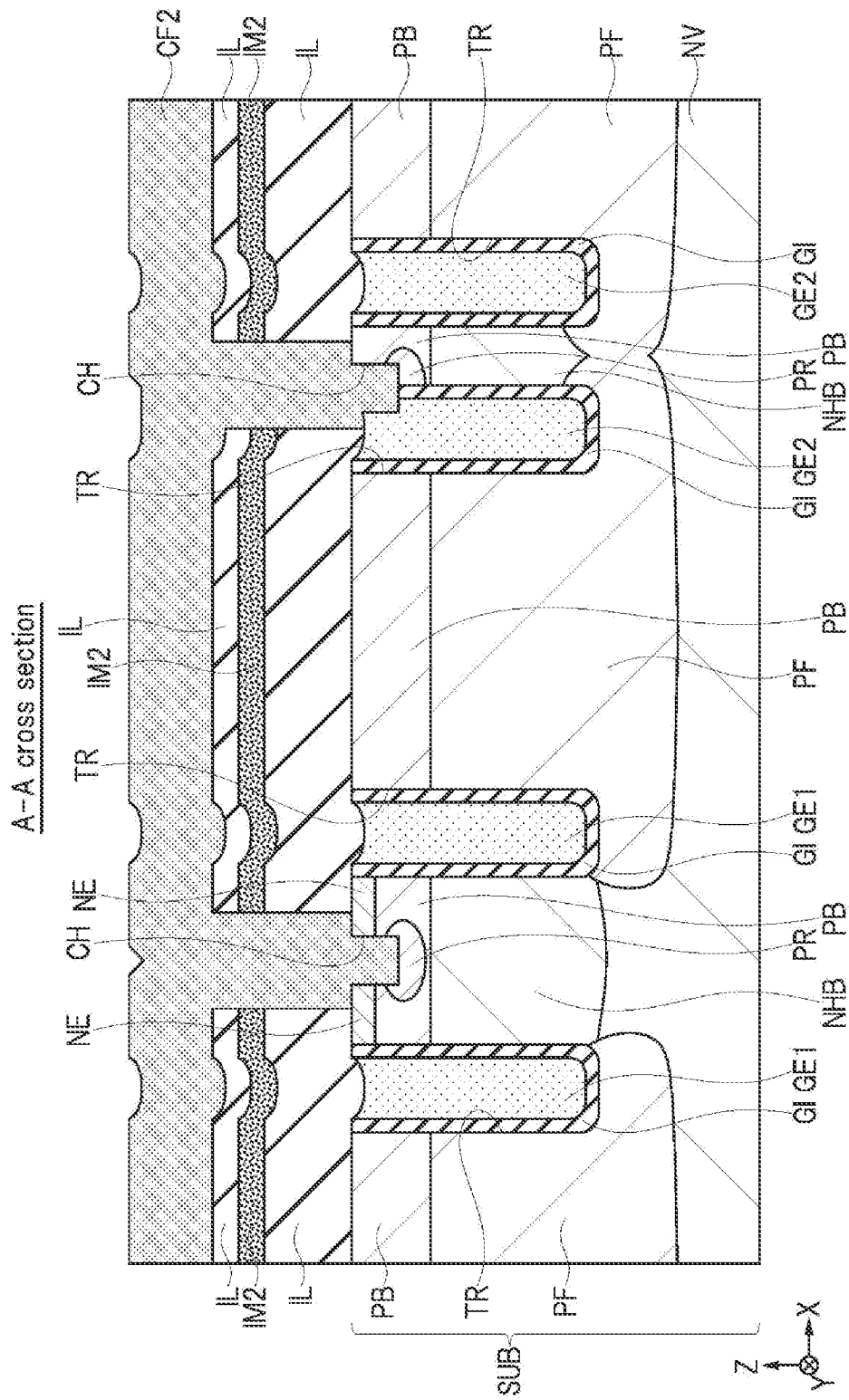
FIG. 20 is a cross-sectional view showing a manufacturing step of the semiconductor device performed after the step shown in FIG. 19.

As shown in FIG. 20, a conductive film CF2 is formed on the upper interlayer insulating film IL2 so as to fill the inside of a contact hole CH. The manufacturing process for forming the conductive film CF2 is the same as in the first embodiment.

Figure 21:
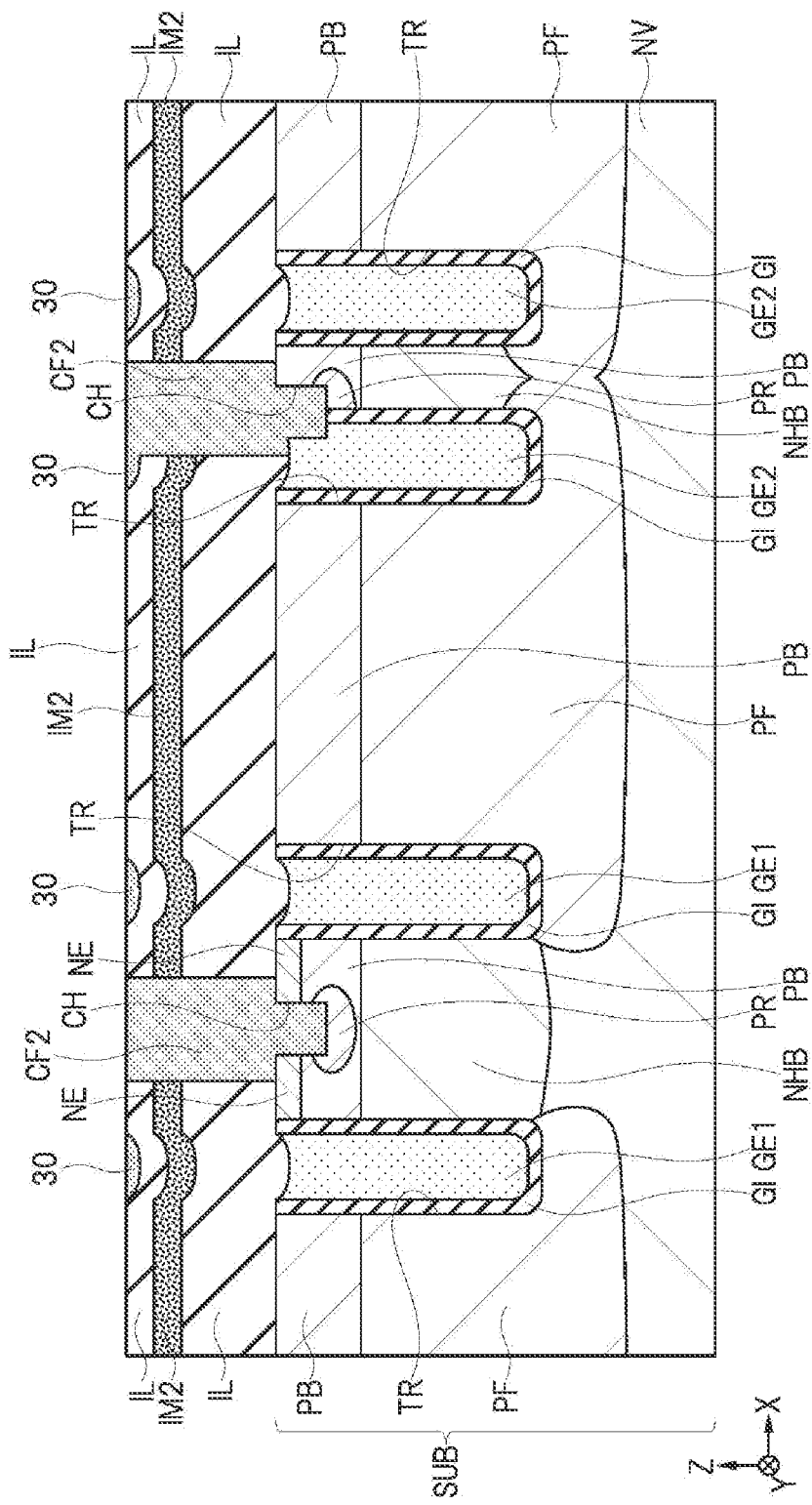
FIG. 21 is a cross-sectional view showing a manufacturing step of the semiconductor device performed after the step shown in FIG. 20.

As shown in FIG. 21, the conductive film CF2 inside the contact hole CH is left by removing the conductive film CF2 located outside the contact hole CH through a polishing using a CMP method. This polishing is performed under conditions where the conductive film CF2 and the upper interlayer insulating film IL2 are easier to polish compared to the second implantation layer IM2.

At the point when the polishing reaches the upper interlayer insulating film IL2, there is a residue 30 in the area reflecting the shape of a concave portion 20. Therefore, to remove the residue 30, the time of the polishing is extended, and the upper interlayer insulating film IL2 is also polished.

As described above, in this polishing, a polishing rate of the second implantation layer IM2 is different from a polishing rate of the upper interlayer insulating film IL2, and is lower than the polishing rate of the upper interlayer insulating film IL2. In other words, the upper interlayer insulating film IL2 is easy to scrape off, but the second implantation layer IM2 is hard to scrape off.

Figure 22:
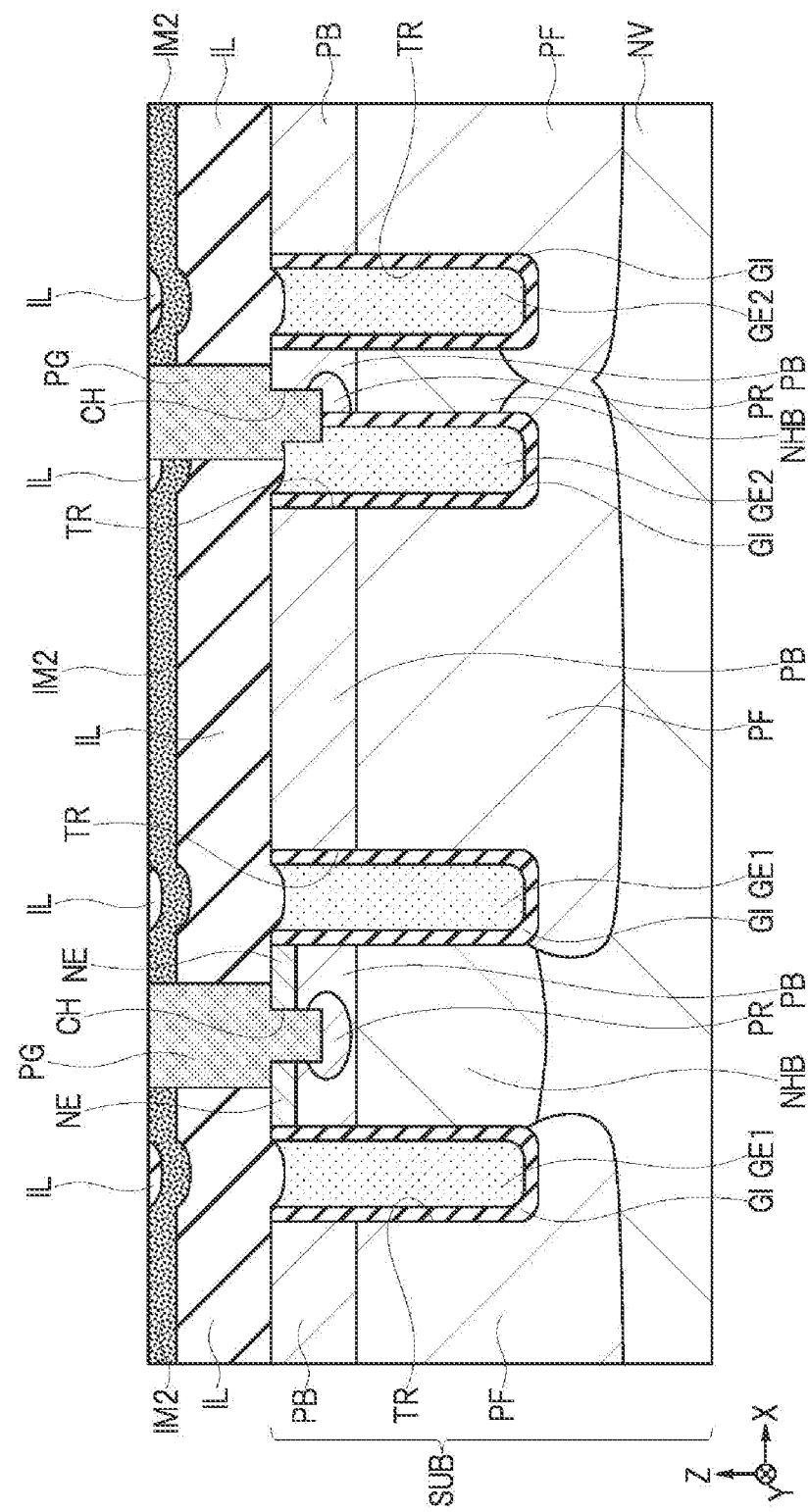
FIG. 22 is a cross-sectional view showing a manufacturing step of the semiconductor device performed after the step shown in FIG. 21.

Therefore, as shown in FIG. 22, in this polishing, the upper interlayer insulating film IL2 is polished, but the residue 30 and the upper interlayer insulating film IL2 can be removed in a relatively short time. At this time, the second implantation layer IM2 functions as a polishing stopper. Therefore, it becomes easy to detect the end point of the polishing. Also, the upper interlayer insulating film IL2 remains in the area reflecting the shape of the concave portion 20.

In this way, it is possible to remove the residue 30 of the conductive film CF2 and form a plug PG made of the conductive film CF2 inside the contact hole CH. Therefore, the same effect as in the first embodiment can be obtained in the second embodiment as well.

Also, by applying the second implantation layer IM2, regardless of a thickness of the interlayer insulating film IL at the time of deposition, the distance from an upper surface of the interlayer insulating film IL after the polishing to an upper surface of a semiconductor substrate SUB can be kept constant. For example, if the interlayer insulating film IL is formed thicker than usual, the implantation energy of the ion-implantation of the second implantation layer IM2 is made larger than usual, and the second implantation layer IM2 is formed at a deep position. In the polishing, the interlayer insulating film IL located above the second implantation layer IM2 is polished, and the second implantation layer IM2 functions as the polishing stopper. Therefore, regardless of the thickness of the interlayer insulating film IL at the time of deposition, a total thickness of the second implantation layer IM2 and the interlayer insulating film IL located below the second implantation layer IM2 is always constant. In this way, by applying the second implantation layer IM2, a thickness of the entire interlayer insulating film IL after the polishing can be stabilized.

Afterwards, similar to the first embodiment, an emitter electrode EE, a gate wiring GW, a field stop region NS, a p-type collector region PC and a collector electrode CE are formed.

As shown in FIG. 10, even when nitrogen (N), silicon (Si) or fluorine (F) is used as the ion species instead of carbon (C), a second implantation layer IM2 with a low polishing rate can be formed. However, since the lower polishing rate can produce a higher effect, it is most preferable to use carbon (C) for forming the second implantation layer IM2.

Third Embodiment

The semiconductor device 100 in the third embodiment will be described below using FIGS. 23 to 26. Note that, in the following description, differences from the first embodiment will be mainly described, and the description of overlapping points with the first embodiment will be omitted.

In the first embodiment, the first implantation layer IM1 was formed after forming the interlayer insulating film IL. In the third embodiment, the formation of the interlayer insulating film IL is divided into two times, and the first implantation layer IM1 is formed in between.

Figure 23:
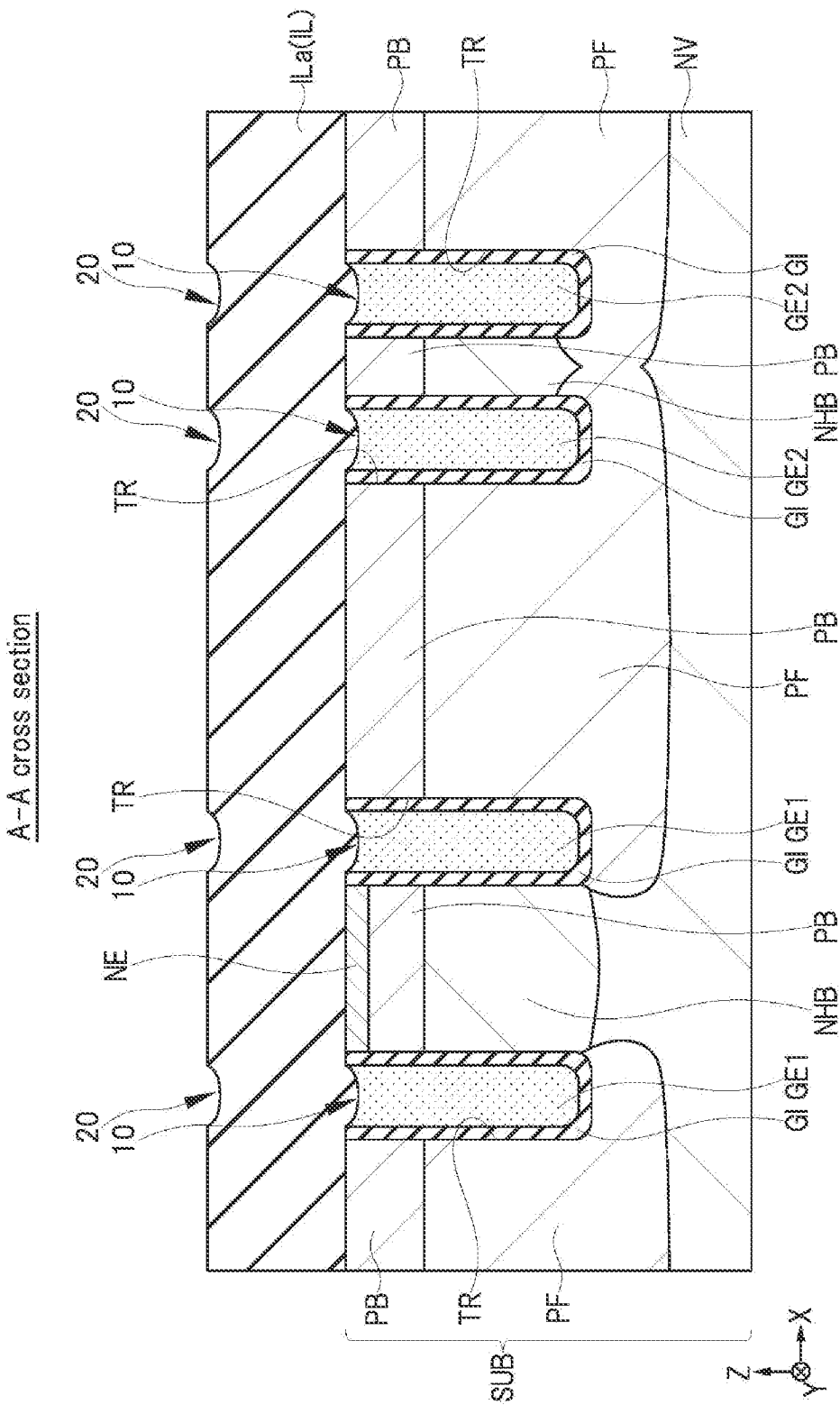
FIG. 23 is a cross-sectional view showing a manufacturing step of a semiconductor device according to a third embodiment.

FIG. 23 shows a manufacturing process following FIG. 8. As shown in FIG. 23, a bottom interlayer insulating film IL1 is formed on the upper surface of a semiconductor substrate SUB, for example, by a CVD method, so as to cover semiconductor element. The bottom interlayer insulating film IL1 is a silicon oxide film that does not contain impurities, for example, a TEOS oxide film. Above a concave portion 10 on upper surfaces of each of gate electrodes GE1 and GE2, a concave portion 20 is formed on an upper surface of the bottom interlayer insulating film IL1.

Figure 24:
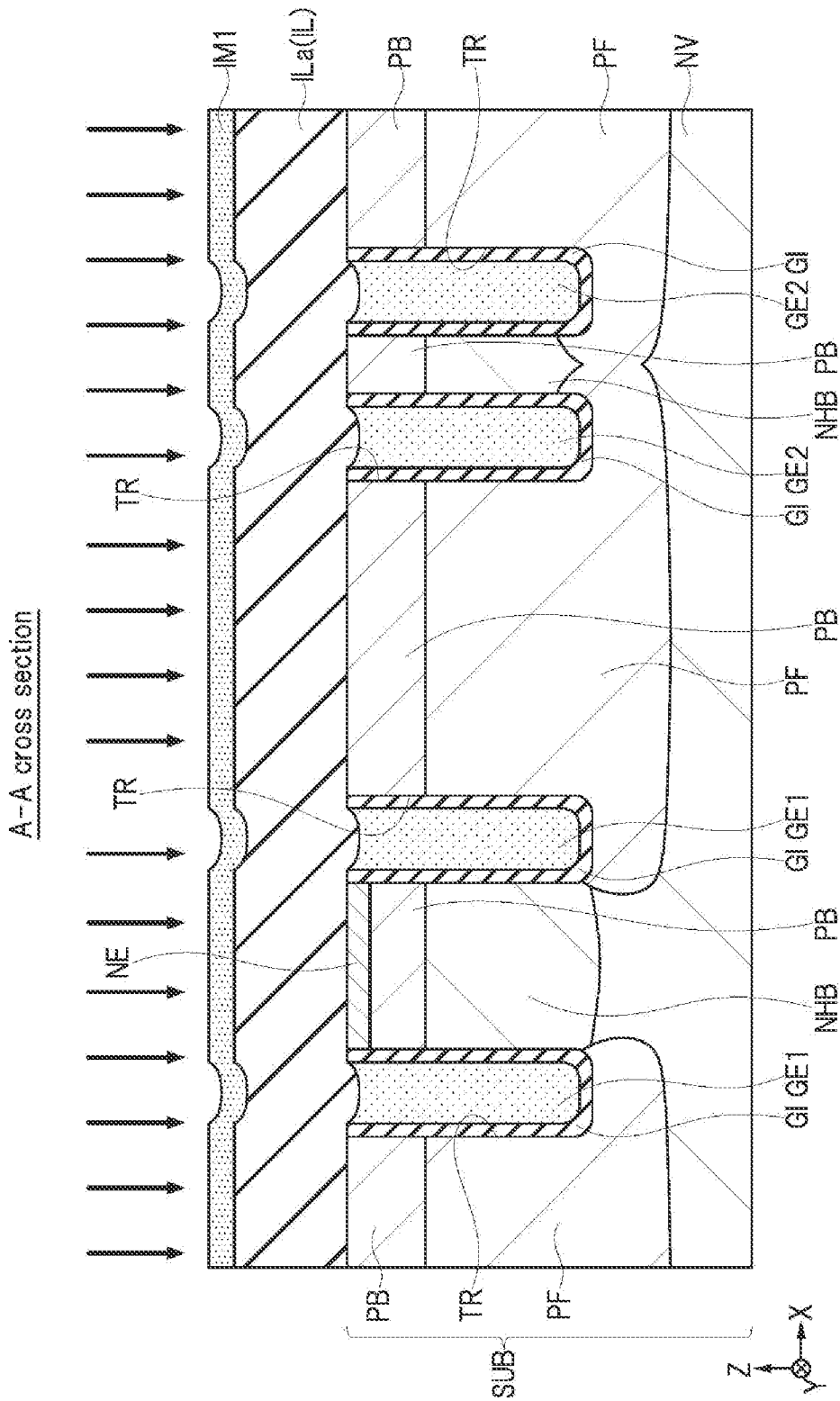
FIG. 24 is a cross-sectional view showing a manufacturing step of the semiconductor device performed after the step shown in FIG. 23.

As shown in FIG. 24, the first implantation layer IM1 is formed in the bottom interlayer insulating film IL1 by ion-implantation. This ion-implantation is performed using phosphorus (P) as an ion species, and under conditions where a dose amount is $1 \times 10^{16}$ cm$^{-2}$ or more. Here, the dose amount is $3 \times 10^{16}$ cm$^{-2}$. Note that this ion-implantation is performed by vertical ion-implantation.

The first implantation layer IM1 in the third embodiment is formed on an upper surface of the bottom interlayer insulating film IL1. In order to form such the first implantation layer IM1, the injection energy of the above ion-implantation is, for example, 1 keV or more and 2 keV or less.

In the first embodiment, it was necessary to increase the injection energy to some extent in order to form the bottom interlayer insulating film IL1 inside the interlayer insulating film IL. Therefore, the concentration profile of the first implantation layer IM1 tends to be wide and gentle. In the third embodiment, the first implantation layer IM1 is formed on the upper surface of the bottom interlayer insulating film IL1 by low injection energy, so the concentration profile of the first implantation layer IM1 becomes narrow and steep. Therefore, a higher density implantation layer IM1 can be formed. That is, in the third embodiment, compared to the first embodiment, it becomes easier to polish the first implantation layer IM1 during polishing treatment.

Figure 25:
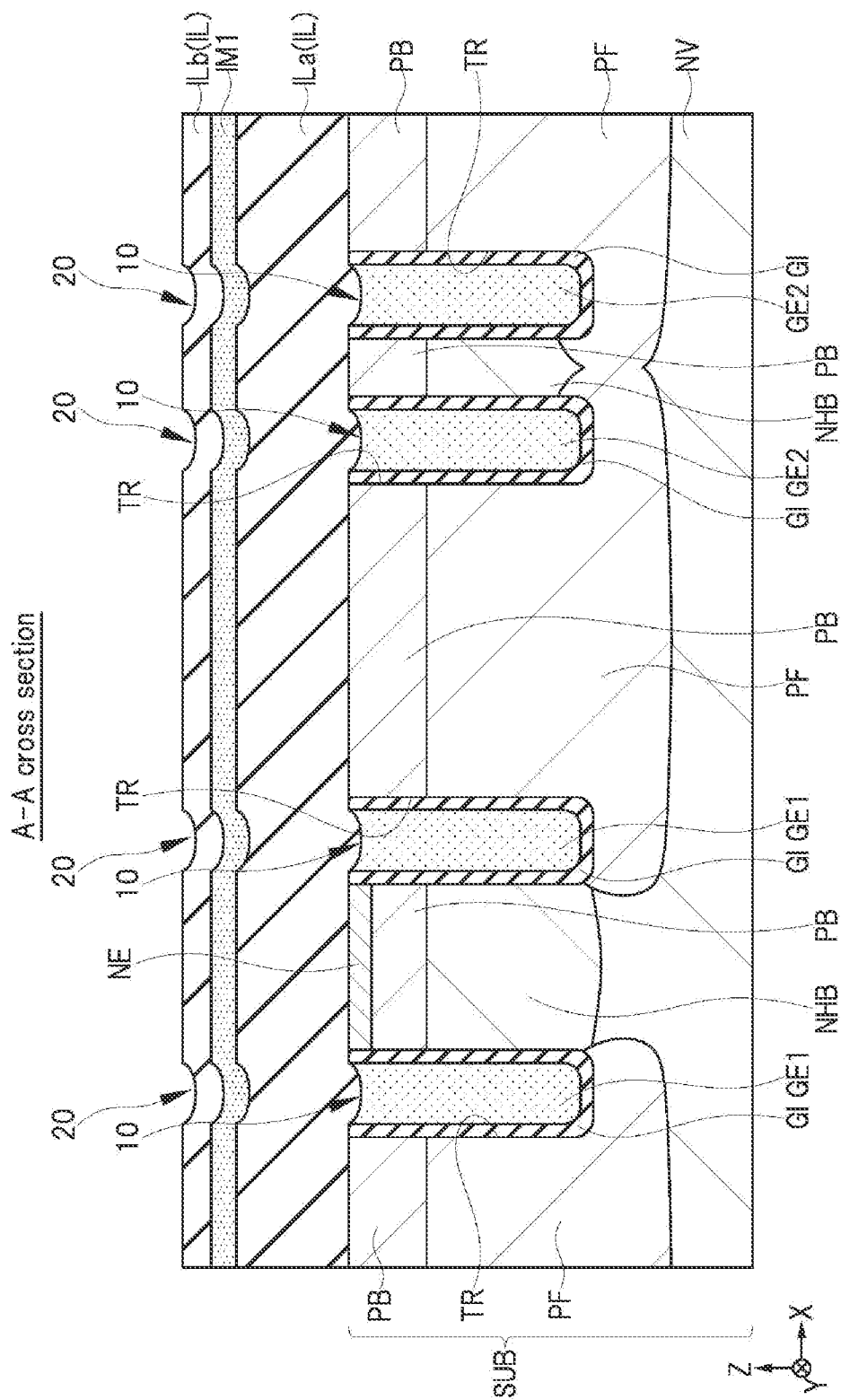
FIG. 25 is a cross-sectional view showing a manufacturing step of the semiconductor device performed after the step shown in FIG. 24.

As shown in FIG. 25, an upper interlayer insulating film IL2 is formed on an upper surface of the first implantation layer IM1, for example, by a CVD method. The upper interlayer insulating film IL2 is a silicon oxide film that does not contain impurities, for example, a TEOS oxide film. Above the concave portion 10 on the upper surface of each of the gate electrodes GE1 and GE2, the concave portion 20 is formed on the upper surface of the upper interlayer insulating film IL2.

Figure 26:
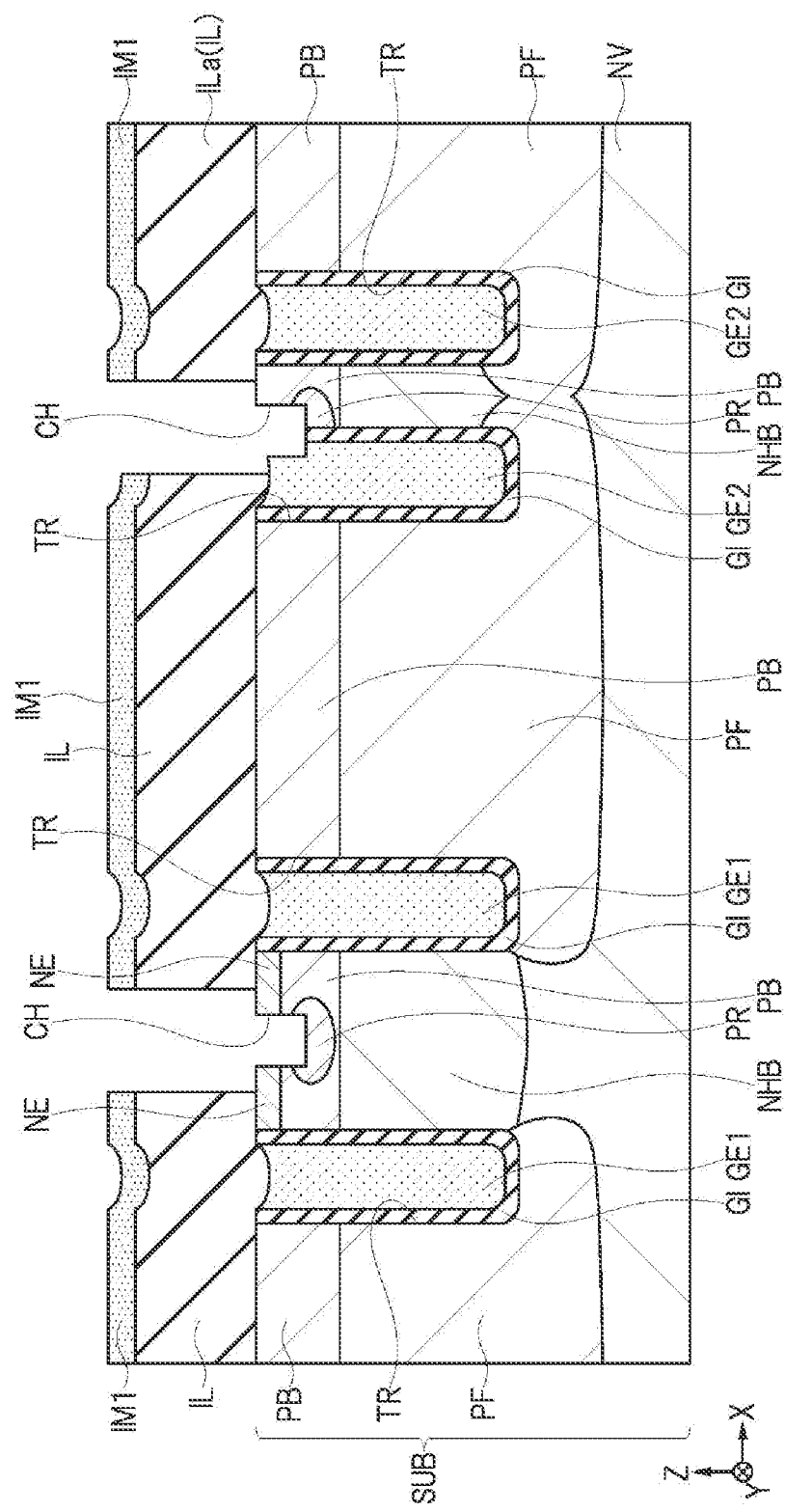
FIG. 26 is a cross-sectional view showing a manufacturing step of the semiconductor device performed after the step shown in FIG. 25.

As shown in FIG. 26, first, a plurality of holes CH are formed in a laminated film consisting of a bottom interlayer insulating film IL1, the second implantation layer IM2 and an upper interlayer insulating film IL2. Next, the p-type high concentration diffusion region PR is formed at the bottom of each of the plurality of holes CH. The manufacturing process for forming each of the plurality of holes CH and the high concentration diffusion region PR is the same as in the first embodiment.

Next, as in the first embodiment, the laminated film is retreated by an isotropic etching using a solution containing, for example, hydrofluoric acid. By this isotropic etching, the upper interlayer insulating film IL2 that had been formed on the first implantation layer IM1 is removed. At this time, it is preferable that the first implantation layer IM1 is exposed, but it is acceptable if a small amount of the upper interlayer insulating film IL2 remains.

In order not to remove the first implantation layer IM1 during the isotropic etching, it is preferable that a thickness of the upper interlayer insulating film IL2 is thicker than the amount of retreat of the laminated film due to the isotropic etching.

The subsequent manufacturing process is the same as that of FIG. 14 and later in the first embodiment.

Note that, in the third embodiment, the second implantation layer IM2 of the second embodiment may be applied instead of the first implantation layer IM1. In that case, in order not to expose the second implantation layer IM2 during the isotropic etching, the thickness of the upper interlayer insulating film IL2 is made thicker than in the third embodiment.

Fourth Embodiment

The semiconductor device 100 in the fourth embodiment will be described below using FIGS. 27 to 30.
Note that, in the following description, differences from the first embodiment will be mainly described, and the description of overlapping points with the first embodiment will be omitted.

In the fourth embodiment, not only the first implantation layer IM1 of the first embodiment but also the second implantation layer IM2 of the second embodiment are formed below the first implantation layer IM1 in the interlayer insulating film IL.

Figure 27:
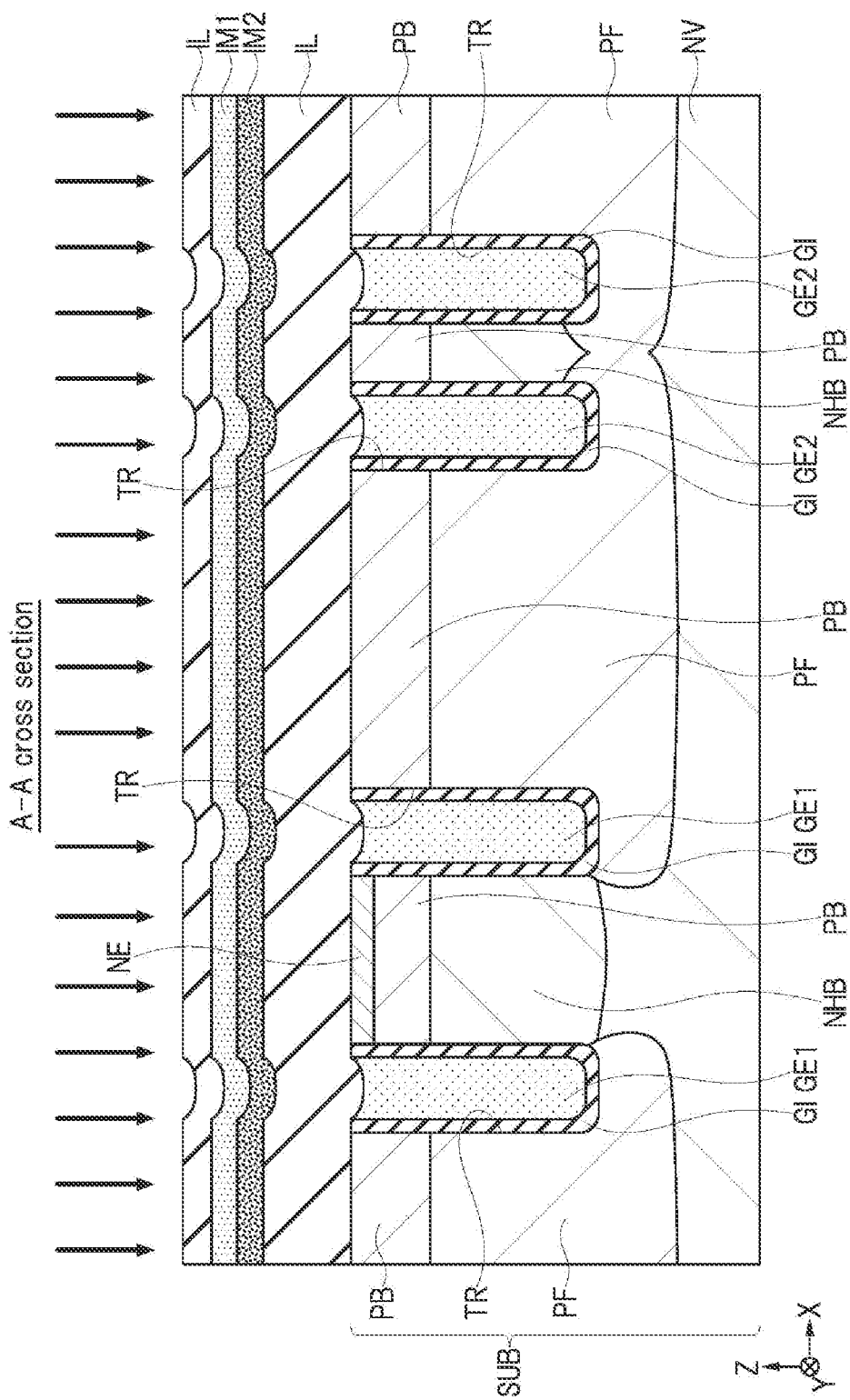
FIG. 27 is a cross-sectional view showing a manufacturing step of a semiconductor device according to a fourth embodiment.

FIG. 27 shows a manufacturing process following FIG. 9. As shown in FIG. 27, the first implantation layer IM1 and the second implantation layer IM2 are formed in the interlayer insulating film IL by ion-implantation. The manufacturing process for forming each of the first implantation layer IM1 and the second implantation layer IM2 is the same as in the first embodiment.

The first implantation layer IM1 and the second implantation layer IM2 are formed inside the interlayer insulating film IL so as not to be exposed on an upper surface of the interlayer insulating film IL. Note that it does not matter which is formed first, the formation of the first implantation layer IM1 or the formation of the second implantation layer IM2. By this ion-implantation, a laminated film consisting of a bottom interlayer insulating film IL1, the second implantation layer IM2, the first implantation layer IM1 and an upper interlayer insulating film IL2 is formed.

Figure 28:
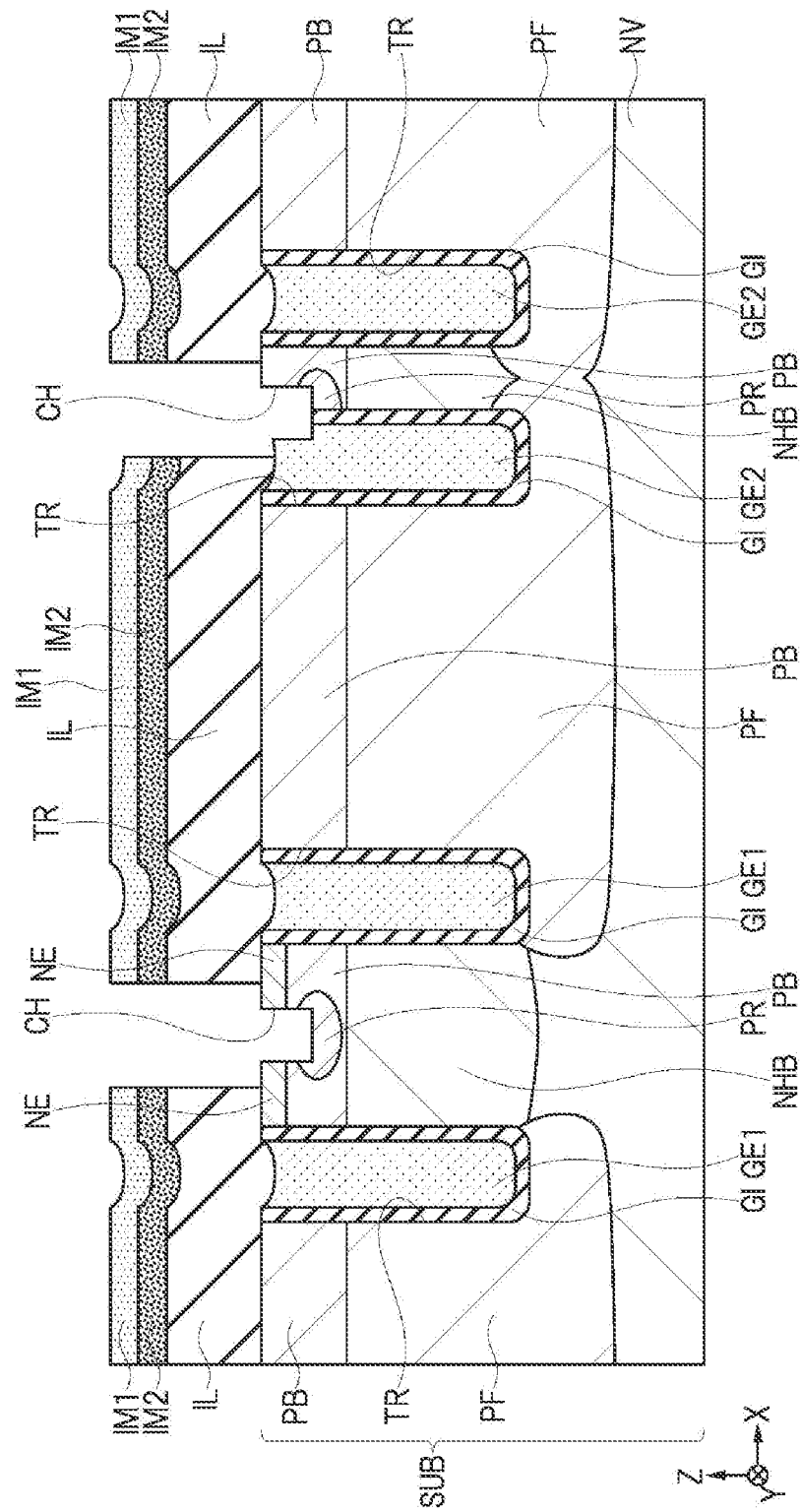
FIG. 28 is a cross-sectional view showing a manufacturing step of the semiconductor device performed after the step shown in FIG. 27.

As shown in FIG. 28, first, multiple holes CH are formed in the laminated film. Next, a p-type high concentration diffusion region PR is formed at the bottom of each of the multiple holes CH. The manufacturing process for forming each of the multiple holes CH and the high concentration diffusion regions PR is the same as in the first embodiment.

Next, as in the first embodiment, the laminated film is retreated by an isotropic etching using a solution containing, for example, hydrofluoric acid. By this isotropic etching, the upper interlayer insulating film IL2 is removed. At this time, it is preferable that the first implantation layer IM1 is exposed.

Figure 29:
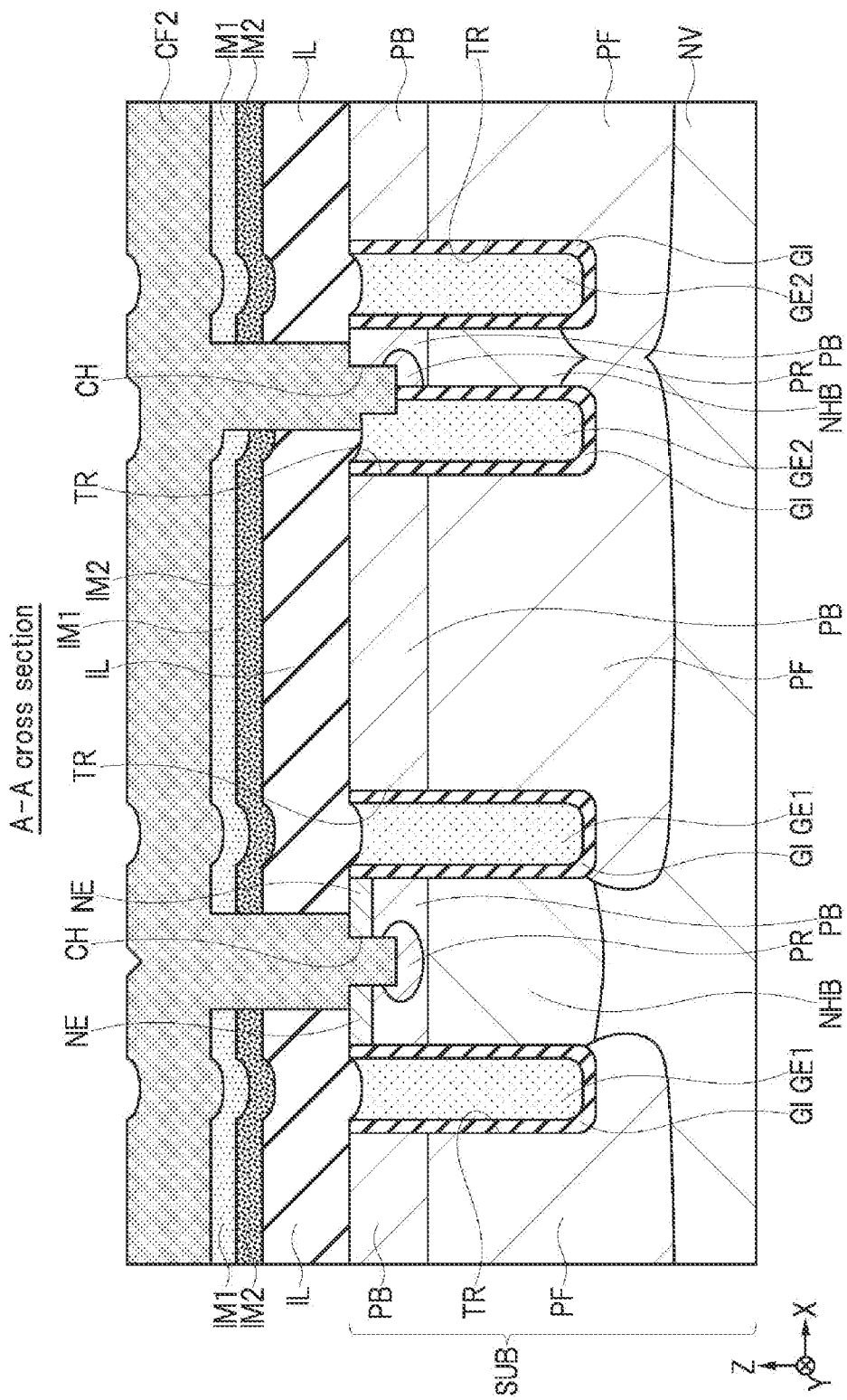
FIG. 29 is a cross-sectional view showing a manufacturing step of the semiconductor device performed after the step shown in FIG. 28.

As shown in FIG. 29, a conductive film CF2 is formed on the first implantation layer IM1 to fill the inside of a contact hole CH. The manufacturing process for forming the conductive film CF2 is the same as in the first embodiment.

Figure 30:
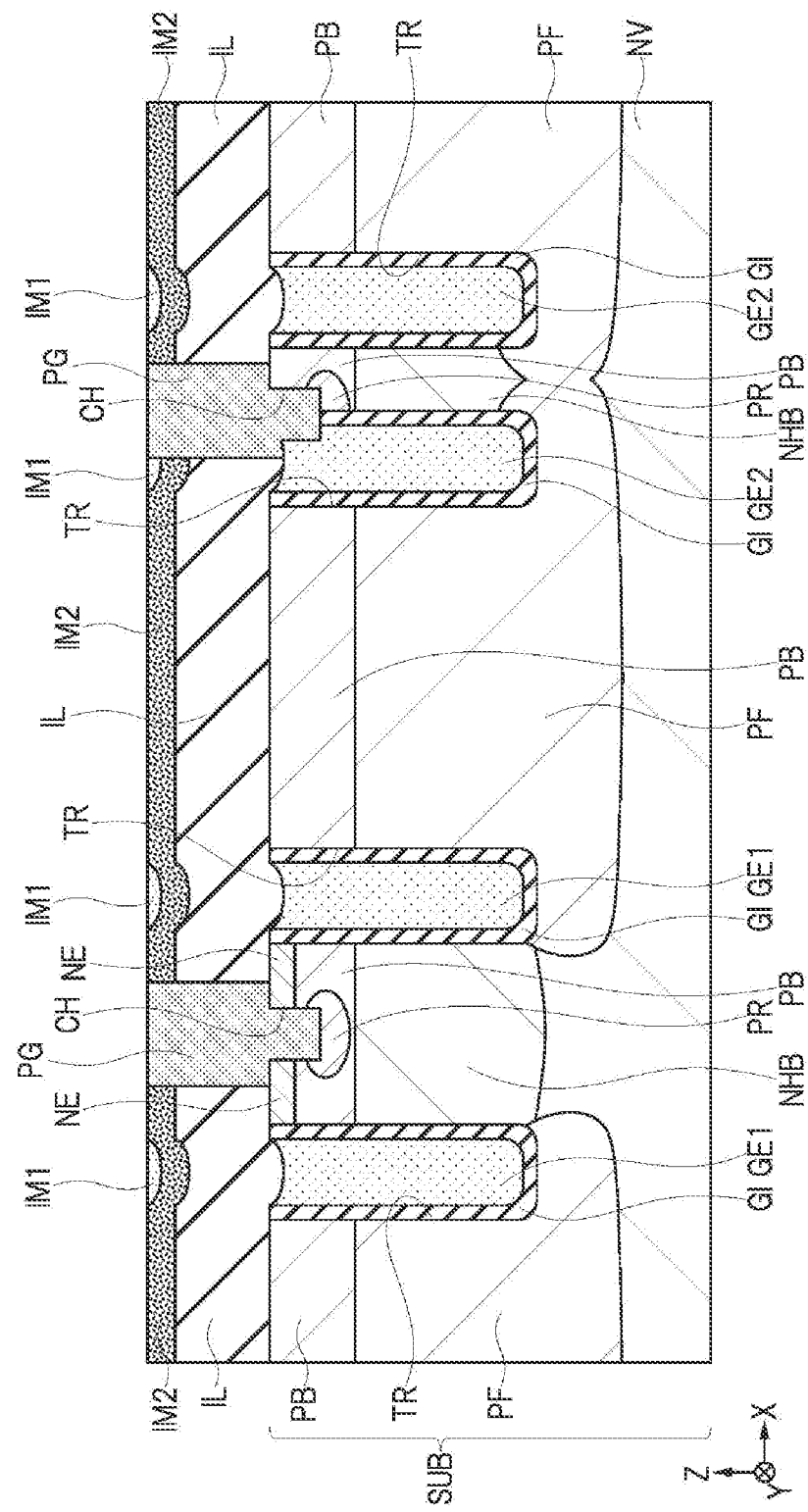
FIG. 30 is a cross-sectional view showing a manufacturing step of the semiconductor device performed after the step shown in FIG. 29.

As shown in FIG. 30, the conductive film CF2 located outside the contact hole CH is removed by a polishing using a CMP method, leaving the conductive film CF2 inside the contact hole CH. Note that this polishing is performed under conditions where the conductive film CF2 and the first implantation layer IM1 are more easily polished compared to the second implantation layer IM2.

When the polishing reaches the first implantation layer IM1, a residue 30 is present at the location reflecting the shape of a concave portion 20. Therefore, to remove the residue 30, the polishing time is extended and the first implantation layer IM1 is also polished.

As described above, in this polishing, a polishing rate of the second implantation layer IM2 is different from a polishing rate of the first implantation layer IM1 and the upper interlayer insulating film IL2, and is lower. In other words, the first implantation layer IM1 located on the second implantation layer IM2 is easily polished, but the second implantation layer IM2 is difficult to polish.

Therefore, in this polishing, although the first implantation layer IM1 is polished, the residue 30 and the implantation layer IM1 can be removed in a relatively short time. At this time, the second implantation layer IM2 functions as a polishing stopper. Also, the first implantation layer IM1 remains at the location reflecting the shape of the concave portion 20.

In the fourth embodiment, since the second implantation layer IM2, which has a lower polishing rate than the first implantation layer IM1 and upper interlayer insulating film IL2 is formed, the polishing can be performed with a higher selectivity ratio, and it becomes easier to detect the end point of the polishing.

Afterwards, as in the first embodiment, an emitter electrode EE, a gate wiring GW, a field stop region NS, a p-type collector region PC, and a collector electrode CE are formed.

Note that the technology of the fourth embodiment may be applied to the third embodiment. In that case, the second implantation layer IM2 is formed below the first implantation layer IM1.

Fifth Embodiment

Hereinafter, a semiconductor device 100 in the fifth embodiment will be described using FIGS. 31 and 32. Note that, in the following description, differences from the first embodiment will be mainly described, and the description of overlapping points with the first embodiment will be omitted.

In the first embodiment, the first implantation layer IM1 was formed after forming multiple holes CH. In the fifth embodiment, the implantation layer IM1 is formed by oblique ion-implantation after forming multiple holes CH.

Figure 31:
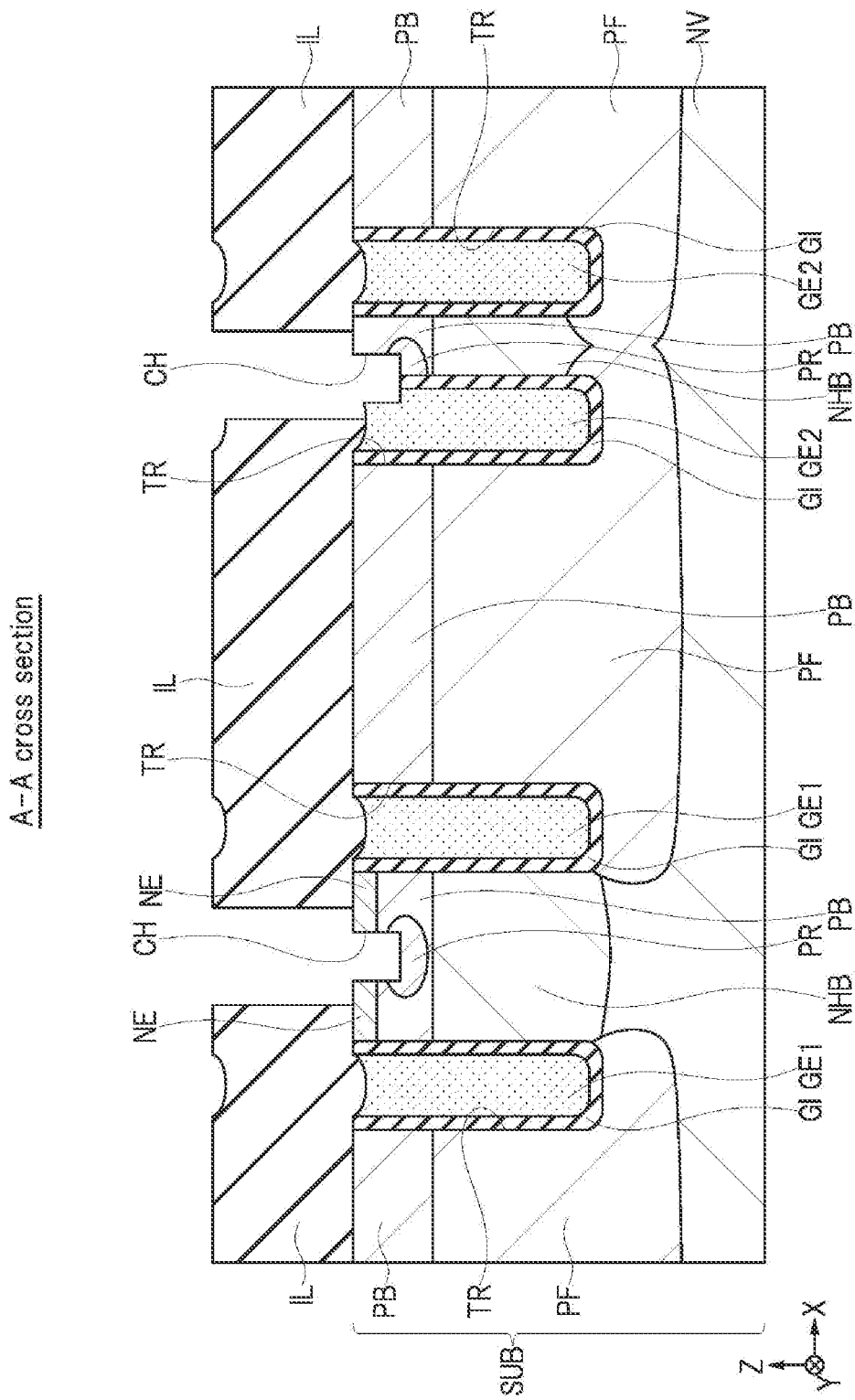
FIG. 31 is a cross-sectional view showing a manufacturing step of a semiconductor device according to a fifth embodiment.

FIG. 31 shows a manufacturing process following FIG. 9. As shown in FIG. 31, first, multiple holes CH are formed in an interlayer insulating film IL. Next, a p-type high concentration diffusion region PR is formed at the bottom of each of the multiple holes CH. The manufacturing process for forming each of the multiple holes CH and the high concentration diffusion region PR is the same as in the first embodiment. Next, as in the first embodiment, the interlayer insulating film IL is retreated by an isotropic etching using a solution containing, for example, hydrofluoric acid.

Figure 32:
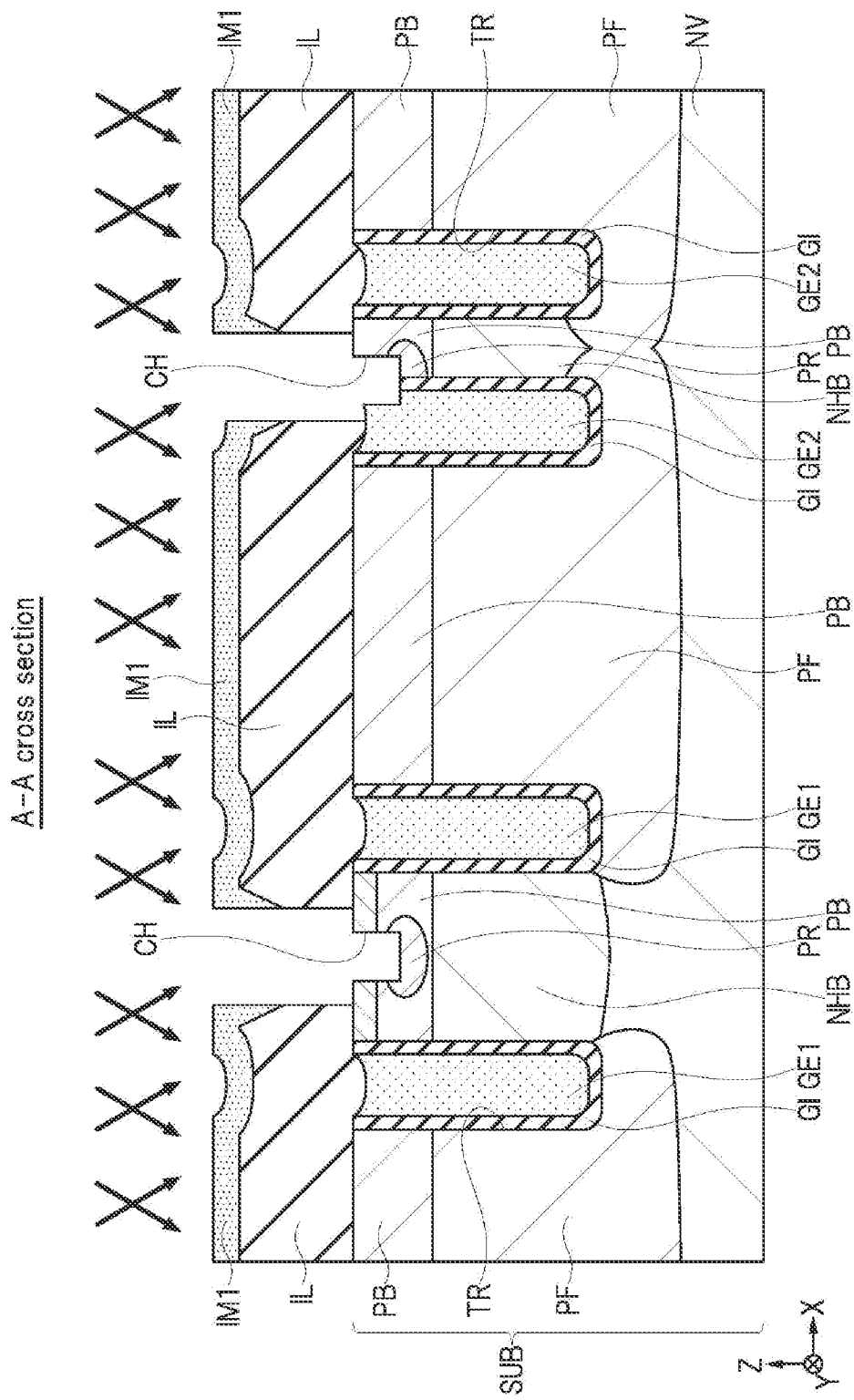
FIG. 32 is a cross-sectional view showing a manufacturing step of the semiconductor device performed after the step shown in FIG. 31.

As shown in FIG. 32, the first implantation layer IM1 is formed in the interlayer insulating film IL by ion-implantation. This ion-implantation is performed using phosphorus (P) as an ion species, and under conditions where a dose amount is $1\times10^{16}$ cm$^{-2}$ or more. Here, the dose amount is $3\times10^{16}$ cm$^{-2}$.

In the fifth embodiment, this ion-implantation is performed by oblique ion-implantation. That is, the ion-implantation of the first implantation layer IM1 is performed at an angle inclined from the perpendicular to an upper surface of a semiconductor substrate SUB. Such an angle is, for example, 20 degrees or more and 40 degrees or less. By applying oblique ion-implantation, the first implantation layer IM1 is formed on the side surface of the interlayer insulating film IL located near the upper part of a contact hole CH, but ions are not implanted near the bottom of the contact hole CH.

The first implantation layer IM1 in the fifth embodiment is formed on an upper surface of the interlayer insulating film IL. To form such the first implantation layer IM1, the injection energy of the above ion-implantation is, for example, 1 keV or more and 2 keV or less.

In the fifth embodiment, as in the third embodiment, the first implantation layer IM1 is formed on the upper surface of the interlayer insulating film IL by low injection energy, so the concentration profile of the first implantation layer IM1 becomes narrower and steeper. Therefore, a higher density implantation layer IM1 can be formed. That is, in the fifth embodiment, compared to the first embodiment, it becomes easier to polish the first implantation layer IM1 during the polishing.

The subsequent manufacturing process is the same as that after FIG. 14 of the first embodiment.

In the fifth embodiment, the second implantation layer IM2 of the second embodiment may be applied instead of the first implantation layer IM1. In that case, to prevent the second implantation layer IM2 from being exposed on an upper surface of the interlayer insulating film IL, the second implantation layer IM2 is formed at a deep position by oblique ion-implantation.

Also, the technology of the fifth embodiment may be applied to the fourth embodiment. In that case, the second implantation layer IM2 is formed below the first implantation layer IM1 by oblique ion-implantation.

Although the present invention has been described based on the above embodiments, the present invention is not limited to the above embodiments and can be variously modified without departing from the spirit thereof.

For example, in the above embodiments, an IGBT with a trench gate structure was exemplified as semiconductor elements, but the semiconductor elements may be a MOSFET with a trench gate structure, a planar MOSFET, a resistor, or a capacitor. That is, the technology described in the above embodiments can be effectively applied in case of forming a step like a concave portion 20 on the upper surface of the interlayer insulating film IL due to the structure of the semiconductor elements.

Also, the material used for the semiconductor substrate SUB is not limited to silicon (Si), and may be silicon carbide (Sic), gallium nitride (GaN), or gallium oxide (Ga2O3).

What is claimed is:

1. A method for manufacturing a semiconductor device comprising steps of:
   (a) providing a semiconductor substrate of a first conductivity type having an upper surface and a bottom surface;
   (b) forming semiconductor elements on the semiconductor substrate;
   (c) forming an interlayer insulating film on the upper surface of the semiconductor substrate so as to cover the semiconductor elements;
   (d) forming a laminated film consisting of a bottom interlayer insulating film, a first implantation layer and an upper interlayer insulating film by performing a first ion-implantation to the interlayer insulating film;
   (e) forming a contact hole penetrating through the upper interlayer insulating film, the first implantation layer and the bottom interlayer insulating film,
   (f) forming a conductive film on the interlayer insulating film so as to fill in the contact hole; and
   (g) removing the conductive film formed on the interlayer insulating film so as to remain the conductive film in the contact hole by a polishing using a CMP method, wherein
   in the step of (g), the upper interlayer insulating film and the first implantation layer are also performed by the polishing, and
   a polishing rate of the first implantation layer and a polishing rate of the upper interlayer insulating film are different.

2. The method for manufacturing the semiconductor device according to claim 1, wherein
   the first ion-implantation is performed at an angle inclined from a direction perpendicular to the upper surface of the semiconductor substrate.

3. The method for manufacturing the semiconductor device according to claim 1, wherein
   in the step of (d), the first ion-implantation is performed under condition in which an ion species is phosphorus and a dose amount is $1\times10^{16}$ $cm^{-2}$ or more,
   the polishing rate of the first implantation layer is higher than the polishing rate of the upper interlayer insulating film, and
   in the step of (g), the bottom interlayer insulating film is used as a polishing stopper.

4. The method for manufacturing the semiconductor device according to claim 3, wherein
   after the step of (c), a concave portion having a depth is formed on the interlayer insulating film, and
   a thickness of the first implantation layer is greater than the depth of the concave portion.

5. The method for manufacturing the semiconductor device according to claim 3,
   the step of (e) including:
   (e1) forming the contact hole so as to reach a position lowered from the upper surface of the semiconductor substrate; and
   (e2) retreating the interlayer insulating film by an isotropic etching, wherein
   an opening width of the contact hole located above the semiconductor substrate is wider than an opening width of the contact hole located below the semiconductor substrate, and
   by the step of (e2), the first implantation layer is exposed.

6. The method for manufacturing the semiconductor device according to claim 3, further comprising steps of:
   (h) forming a second implantation layer in the interlayer insulating film by a second ion-implantation, wherein
   the second implantation layer is located below the first implantation layer in the interlayer insulating film,
   in the step of (h), the second ion-implantation is performed under condition in which an ion species is carbon and a dose amount is $1\times10^{16}$ $cm^{-2}$ or more,
   a polishing rate of the second implantation layer is lower than the polishing rate of the first implantation layer and the polishing rate of the upper interlayer insulating film, and
   in the step of (g), the second implantation layer is used as the polishing stopper.

7. The method for manufacturing the semiconductor device according to claim 1, wherein
   in the step of (d), an ion species is carbon and a dose amount is $1\times10^{16}$ $cm^{-2}$ or more,
   the polishing rate of the first implantation layer is lower than the polishing rate of the upper interlayer insulating film,
   in the step of (g), the first implantation layer is used as a polishing stopper.

8. The method for manufacturing the semiconductor device according to claim 7,
   the step of (e) including:
   (e1) forming the contact hole so as to reach a position lowered from the upper surface of the semiconductor substrate, and
   (e2) retreating the interlayer insulating film by an isotropic etching, wherein
   an opening width of the contact hole located above the semiconductor substrate is wider than an opening width of the contact hole located below the semiconductor substrate,
   by the step of (e2), the first implantation layer is not exposed.

9. A method for manufacturing a semiconductor device comprising steps of:
   (a) providing a semiconductor substrate of a first conductivity type having an upper surface and a bottom surface;
   (b) forming semiconductor elements on the semiconductor substrate;
   (c) forming a bottom interlayer insulating film on the upper surface of the semiconductor substrate so as to cover the semiconductor elements;
   (d) forming a first implantation layer on the bottom interlayer insulating film by performing a first ion-implantation to the bottom interlayer insulating film;
   (e) forming an upper interlayer insulating film on the first implantation layer;
   (f) forming a contact hole penetrating through the upper interlayer insulating film, the first implantation layer and the bottom interlayer insulating film;
   (g) forming a conductive film on the upper interlayer insulating film so as to fill in the contact hole; and
   (h) removing the conductive film formed on the upper interlayer insulating film so as to remain the conductive film in the contact hole by a polishing using a CMP method, wherein
   in the step of (h), the upper interlayer insulating film and the first implantation layer are also performed by the polishing, and
   a polishing rate of the first implantation layer and a polishing rate of the upper interlayer insulating film are different.

10. The method for manufacturing the semiconductor device according to claim 9, wherein the step of (f) including (f1) forming the contact hole so as to reach a position lowered from the upper surface of the semiconductor substrate, and (f2) retreating the upper interlayer insulating film, the first implantation layer and the bottom interlayer insulating film by an isotropic etching, wherein an opening width of the contact hole located above the semiconductor substrate is wider than an opening width of the contact hole located below the semiconductor substrate, and a thickness of the upper interlayer insulating film is greater than a retreated amounts of the upper interlayer insulating film, the first implantation layer and the bottom interlayer insulating film at the step of (f2).

11. The method for manufacturing the semiconductor device according to claim 9, wherein the first ion-implantation is performed at an angle inclined from a direction perpendicular to the upper surface of the semiconductor substrate.

12. The method for manufacturing the semiconductor device according to claim 11, the step of (f) including (f1) forming the contact hole so as to reach a position lowered from the upper surface of the semiconductor substrate, and (f2) retreating the upper interlayer insulating film, the first implantation layer and the bottom interlayer insulating film by an isotropic etching, wherein an opening width of the contact hole located above the semiconductor substrate is wider than an opening width of the contact hole located below the semiconductor substrate.

13. The method for manufacturing the semiconductor device according to claim 1, wherein the step of (b) including:

(b1) forming a trench in the semiconductor substrate from the upper surface toward the bottom surface;

(b2) forming a gate dielectric film in the trench; and (b3) forming a gate electrode in the trench via the gate dielectric film, and by the steps of (b1) to (b3), a concave portion is formed in an upper surface of the gate electrode.

14. The method for manufacturing the semiconductor device according to claim 13, wherein the upper interlayer insulating film and the bottom interlayer insulating film are formed by a CVD method, and a concave portion is formed on an upper surface of the upper interlayer insulating film and an upper surface of the bottom interlayer insulating film immediately above the concave portion of the upper surface of the gate electrode.

15. The method for manufacturing the semiconductor device according to claim 13, further comprising steps of:

(i) after the step of (h), forming a gate wiring on the bottom interlayer insulating film, wherein the contact hole is formed so as to reach the gate electrode, and the gate electrode is electrically connected to the gate wiring via the conductive film in the contact hole.

16. The method for manufacturing the semiconductor device according to claim 13, further comprising steps of:

(j) forming a base region of a second conductivity type opposite to the first conductivity type in the semiconductor substrate, and (k) after the step of (g), forming an emitter electrode on the bottom interlayer insulating film, wherein the contact hole is formed so as to traverse the gate electrode, the gate dielectric film and the base region, the gate electrode is electrically connected to the emitter electrode via the conductive film in the contact hole.

* * * * *